(12) United States Patent
Nishimura et al.

(10) Patent No.: US 9,261,902 B2
(45) Date of Patent: Feb. 16, 2016

(54) ELECTRIC DEVICE WITH A TILT MECHANISM

(71) Applicant: BROTHER KOGYO KABUSHIKI KAISHA, Nagoya-shi, Aichi-ken (JP)

(72) Inventors: Yoichiro Nishimura, Nagoya (JP); Tomohiro Wada, Kuwana (JP)

(73) Assignee: BROTHER KOGYO KABUSHIKI KAISHA, Nagoya-Shi, Aichi-Ken (JP)

( * ) Notice: Subject to any disclaimer, the term of this patent is extended or adjusted under 35 U.S.C. 154(b) by 166 days.

(21) Appl. No.: 13/951,962

(22) Filed: Jul. 26, 2013

(65) Prior Publication Data

US 2014/0029180 A1    Jan. 30, 2014

(30) Foreign Application Priority Data

Jul. 26, 2012    (JP) ................................. 2012-166058

(51) Int. Cl.
| | |
|---|---|
| G06F 1/16 | (2006.01) |
| H05K 5/00 | (2006.01) |
| H05K 7/00 | (2006.01) |
| G09G 5/00 | (2006.01) |
| G06F 17/00 | (2006.01) |
| A47G 29/00 | (2006.01) |
| F16M 13/02 | (2006.01) |
| H04N 1/00 | (2006.01) |
| G06T 1/00 | (2006.01) |
| F16M 11/10 | (2006.01) |

(52) U.S. Cl.
CPC ........... *G06F 1/1601* (2013.01); *F16M 13/022* (2013.01); *G06F 1/1615* (2013.01); *G06F 1/1679* (2013.01); *H04N 1/00496* (2013.01); *H05K 7/00* (2013.01); *F16M 11/10* (2013.01); *F16M 2200/024* (2013.01); *G06T 1/00* (2013.01); *H04N 2201/0094* (2013.01)

(58) Field of Classification Search
CPC ............ H05K 7/00; G06T 1/00; A47G 29/00; F16M 13/022; G09G 5/00; G06F 1/1601; G06F 1/1615; G06F 1/1679
USPC .......................... 361/679.04, 679.02, 679.21, 361/679.26–679.28; 345/156, 418; 248/371
See application file for complete search history.

(56) References Cited

U.S. PATENT DOCUMENTS

| | | | |
|---|---|---|---|
| 2009/0278000 A1* | 11/2009 | Hu | ............................. 248/122.1 |
| 2011/0292577 A1 | 12/2011 | Shibuya et al. | |

FOREIGN PATENT DOCUMENTS

| | | |
|---|---|---|
| JP | H02-136284 U | 11/1990 |
| JP | H10-063192 A | 3/1998 |
| JP | H10-228243 A | 8/1998 |
| JP | H11-338375 A | 12/1999 |
| JP | 2010-005941 A | 1/2010 |
| JP | 2011-248946 A | 12/2011 |

\* cited by examiner

*Primary Examiner* — Courtney Smith
*Assistant Examiner* — Zhengfu Feng
(74) *Attorney, Agent, or Firm* — Merchant & Gould PC

(57) ABSTRACT

An electric device with a tilt mechanism is provided. The electric device includes a main body and a panel body rotatable with respect to the main body about a rotation axis. The electric device includes an engagement piece mounted on one of the panel body and the main body and an engaging piece mounted on the other one of the panel body and the main body. The engagement piece is formed to have a plurality of teeth on a plane spreading orthogonally with respect to the rotation axis. The plurality of teeth are disposed along a circumference centered on the rotation axis at a predetermined interval from one another. The engaging piece includes an engaging claw configured to be movable to be closer to and farther from the engagement piece, and an urging member configured to urge the engaging claw in a direction to be closer to the engagement piece.

9 Claims, 30 Drawing Sheets

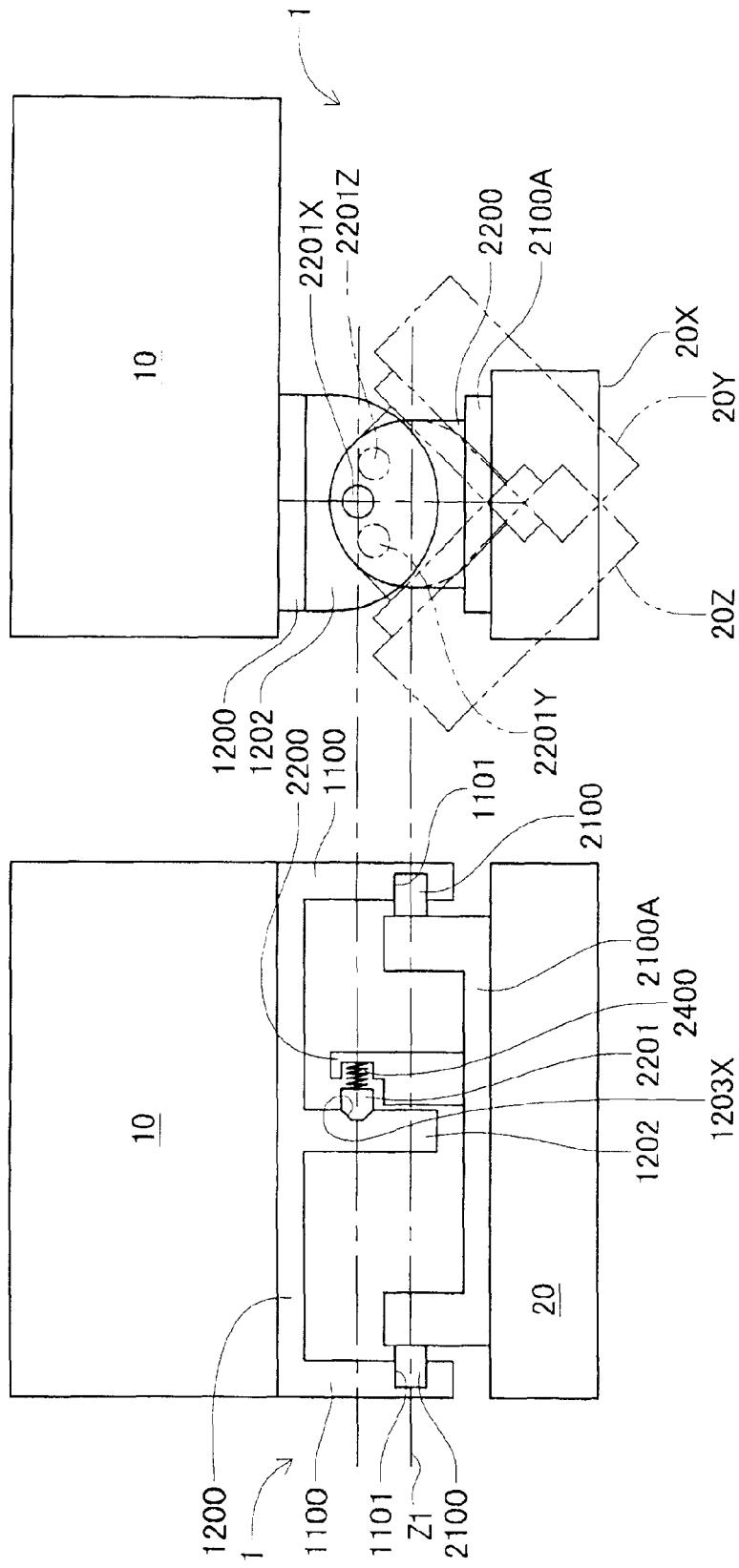

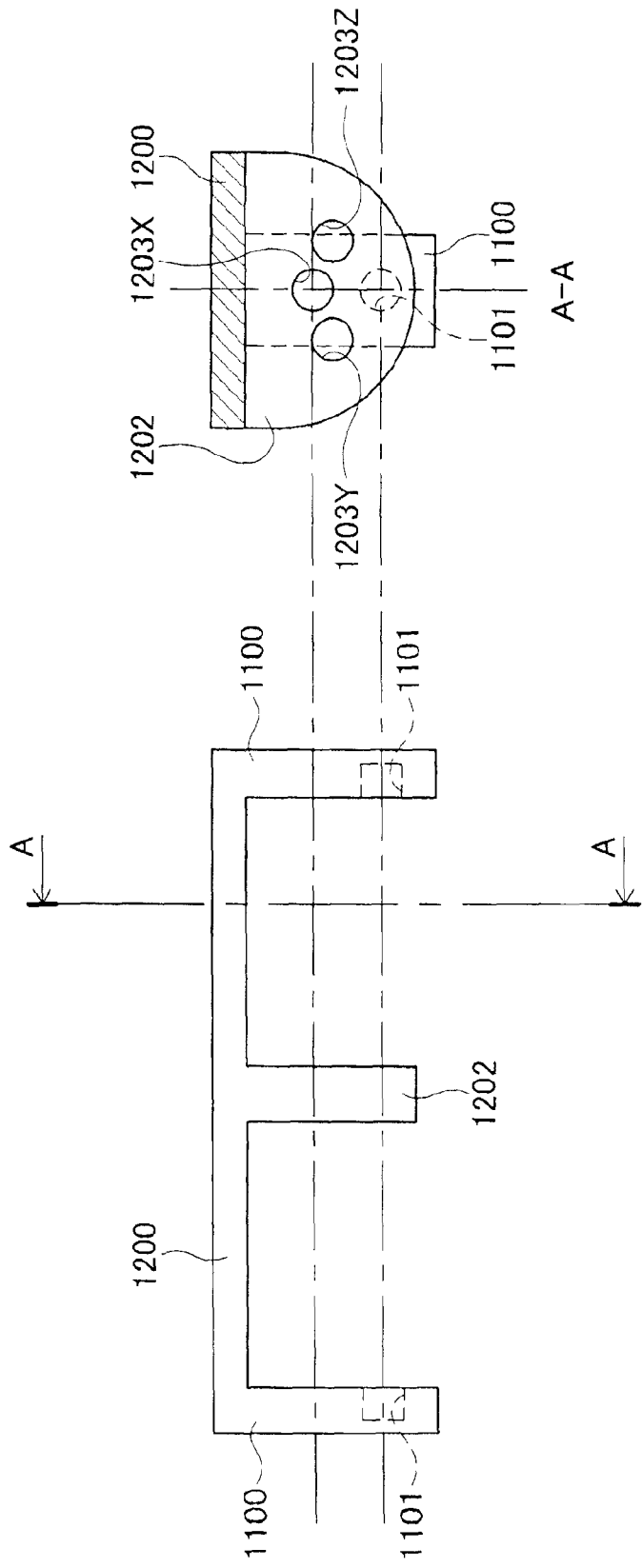

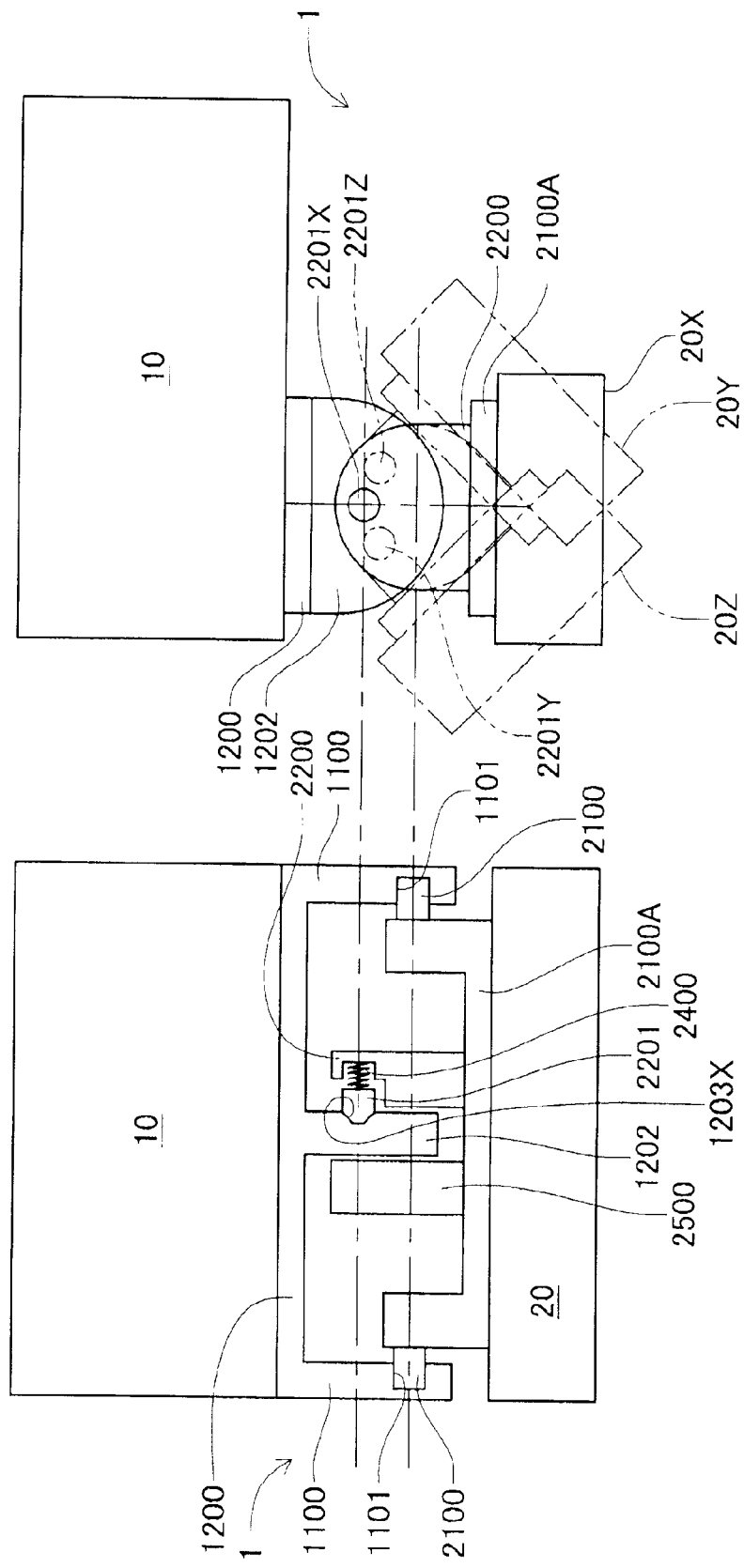

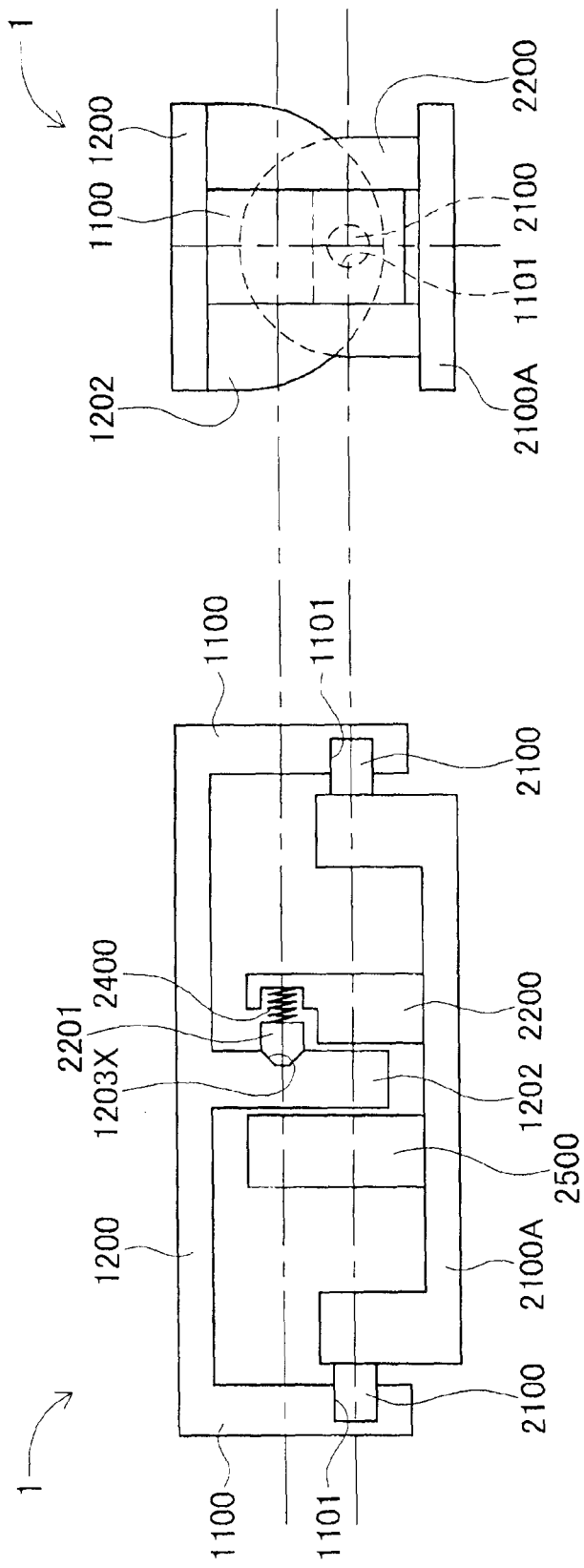

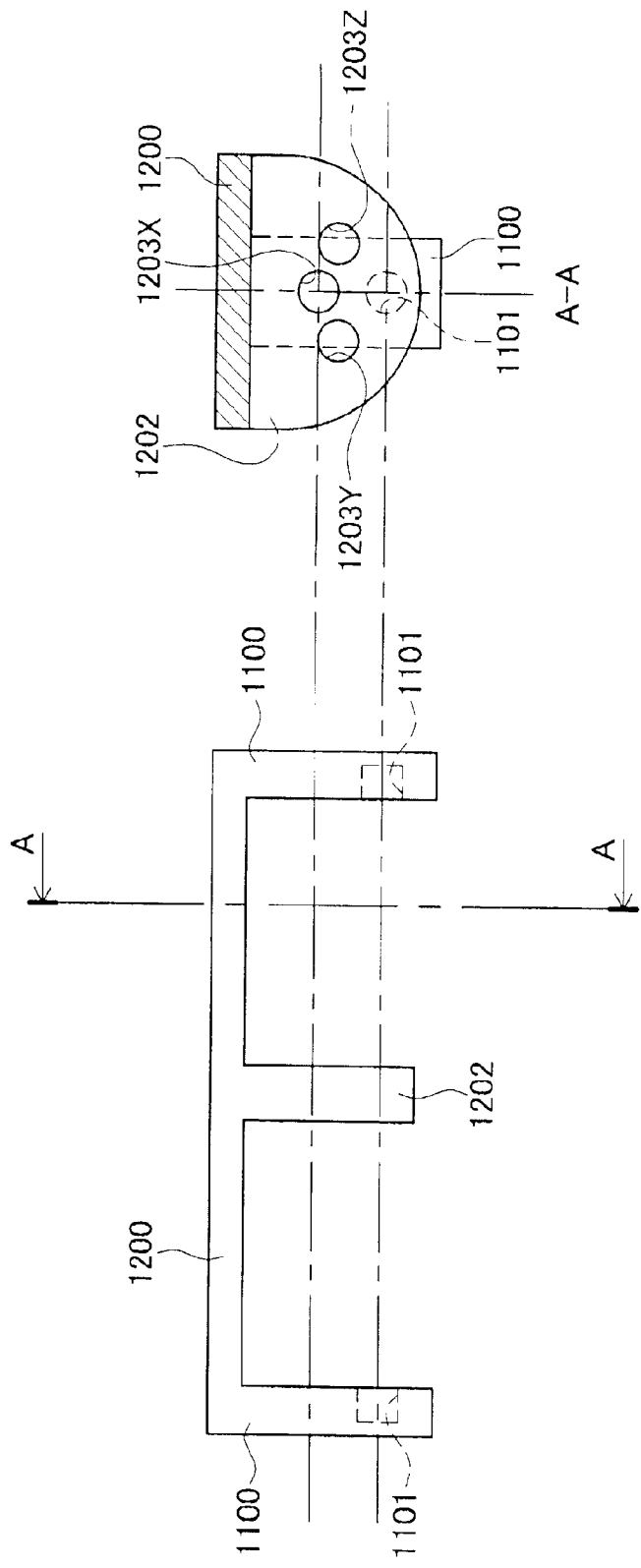

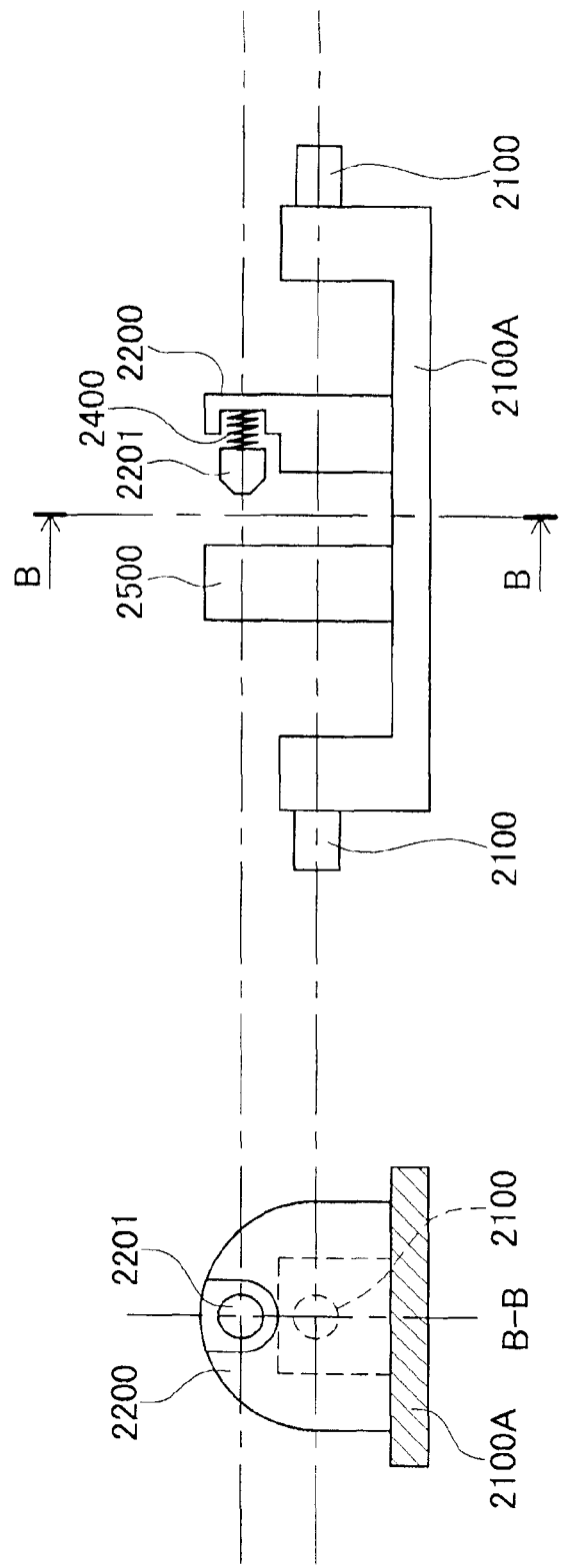

ELECTRIC DEVICE WITH A TILT MECHANISM

CROSS REFERENCE TO RELATED APPLICATION

This application claims priority from Japanese Patent Application No. 2012-166058, filed on Jul. 26, 2012, the entire subject matter of which is incorporated herein by reference.

BACKGROUND

1. Technical Field

An aspect of the present invention relates to an electric device having a tilt mechanism, which is capable of adjusting a tilt angle of a panel device with respect to a main body of the electric device.

2. Related Art

An electric device having a tilt-adjustable mechanism to adjust tilt angle of a panel device, such as a liquid crystal panel, with respect to a main body of the electric device is known. The tilt-adjustable mechanism may include, for example, a frictionally-holding mechanism to hold the panel device in a tilted posture by use of frictional force. For another example, the tilt-adjustable mechanism may include a ratchet gear to maintain the panel device in the tilted posture. When the ratchet gear is used in the tilt-adjustable mechanism, engagement between the ratchet gear and a ratchet may be released by an effect of a spring.

SUMMARY

In recent years, the panel device on the electric device may be equipped not only with a liquid crystal display but also with operative buttons, which are integrally formed with the liquid crystal display. As a result, and in consideration of requirements in design and appearance, a size of the panel device tends to be increased. Therefore, in order to hold the panel in the tilted posture, it may be necessary that a tilt mechanism should provide greater torque than currently known tilt mechanisms. With the tilt mechanism with greater torque, the size-increased panel device may be affected by the increased torque and may be, for example, deformed or damaged. Further, with the greater torque, operational load to move the size-increased panel device for adjusting the tilt angle may not be stabilized.

The present invention is advantageous in that an electric device with a tilt mechanism, in which deformation of a panel device is preventable, and in which operational load to tilt the panel device may be stabilized, is provided.

According to an aspect of the present invention, an electric device including a main body and a panel body is provided. The panel body includes at least one of a display unit and an input unit, and is rotatable with respect to the main body about a rotation axis. The electric device includes an engagement piece mounted on one of the panel body and the main body, and is formed to have a plurality of teeth on a plane which spreads orthogonally with respect to the rotation axis. The plurality of teeth are disposed along a circumference centered on the rotation axis at a predetermined interval from one another. The electric device further includes an engaging piece mounted on the other one of the panel body and the main body. The engaging piece includes an engaging claw configured to be movable to be closer to and farther from the engagement piece; and an urging member configured to urge the engaging claw in a direction to be closer to the engagement piece.

BRIEF DESCRIPTION OF THE ACCOMPANYING DRAWINGS

FIG. 18A is an illustrative plane view of the tilt assembly with the main body of the MFP according to the embodiment of the present invention. FIG. 18B is an illustrative side view of the tilt assembly, showing tilting motions of the panel body, in the MFP according to the embodiment of the present invention.

FIG. 20A is an illustrative plane view of the part of the tilt assembly on the main body of the MFP according to the embodiment of the present invention. FIG. 20B is an illustrative cross-sectional view of the part of the tilt assembly on the main body in the MFP according to the embodiment of the present invention taken along a line A-A shown in FIG. 20A.

FIG. 22A is an illustrative plane view of the tilt assembly including an engagement piece support on the panel body with the main body of the MFP according to the embodiment of the present invention. FIG. 22B is an illustrative side view of the tilt assembly, showing tilting motions of the panel body, in the MFP according to the embodiment of the present invention.

FIG. 23A is an illustrative plane view of the tilt assembly with the engagement piece support in the MFP according to the embodiment of the present invention. FIG. 23B is an illustrative side view of the tilt assembly with the engagement piece support in the MFP according to the embodiment of the present invention.

FIG. 24A is an illustrative plane view of the part of the tilt assembly on the main body of the MFP according to the embodiment of the present invention. FIG. 24B is an illustrative cross-sectional view of the part of the tilt assembly on the main body in the MFP according to the embodiment of the present invention taken along a line A-A shown in FIG. 24A.

FIG. 25A is an illustrative cross-sectional view of a part of the tilt assembly on the panel body in the MFP according to the embodiment of the present invention taken along a line B-B shown in FIG. 25B. FIG. 25B is an illustrative plane view of the part of the tilt assembly with the engagement piece support on the panel body in the MFP according to the embodiment of the present invention.

DETAILED DESCRIPTION

Hereinafter, embodiments of the present invention will be described with reference to the accompanying drawings. It is noted that various connections are set forth between elements in the following description. These connections in general, and unless specified otherwise, may be direct or indirect, and this specification is not intended to be limiting in this respect.

1. MFP with a Tilt Assembly

An MFP 2 being an example of an electric device includes a main body 10 and a panel body 20. As depicted in FIGS. 1-4, the panel body 20 is arranged in a tilted posture with respect to the main body 10, and a tilt angle of the panel body 20 is adjusted by a tilt assembly 1, which will be described later in detail. The panel body 20 includes a liquid crystal display 20A and an operable button unit 20B, which is a touch-sensitive panel. The panel body 20 is formed to have a width, which is greater than a half of a width of the main body 10, and a widthwise direction of the panel body 20 may be herein referred to as a longitudinal direction of the panel body 20.

2. Tilt Assembly

Figure 1:
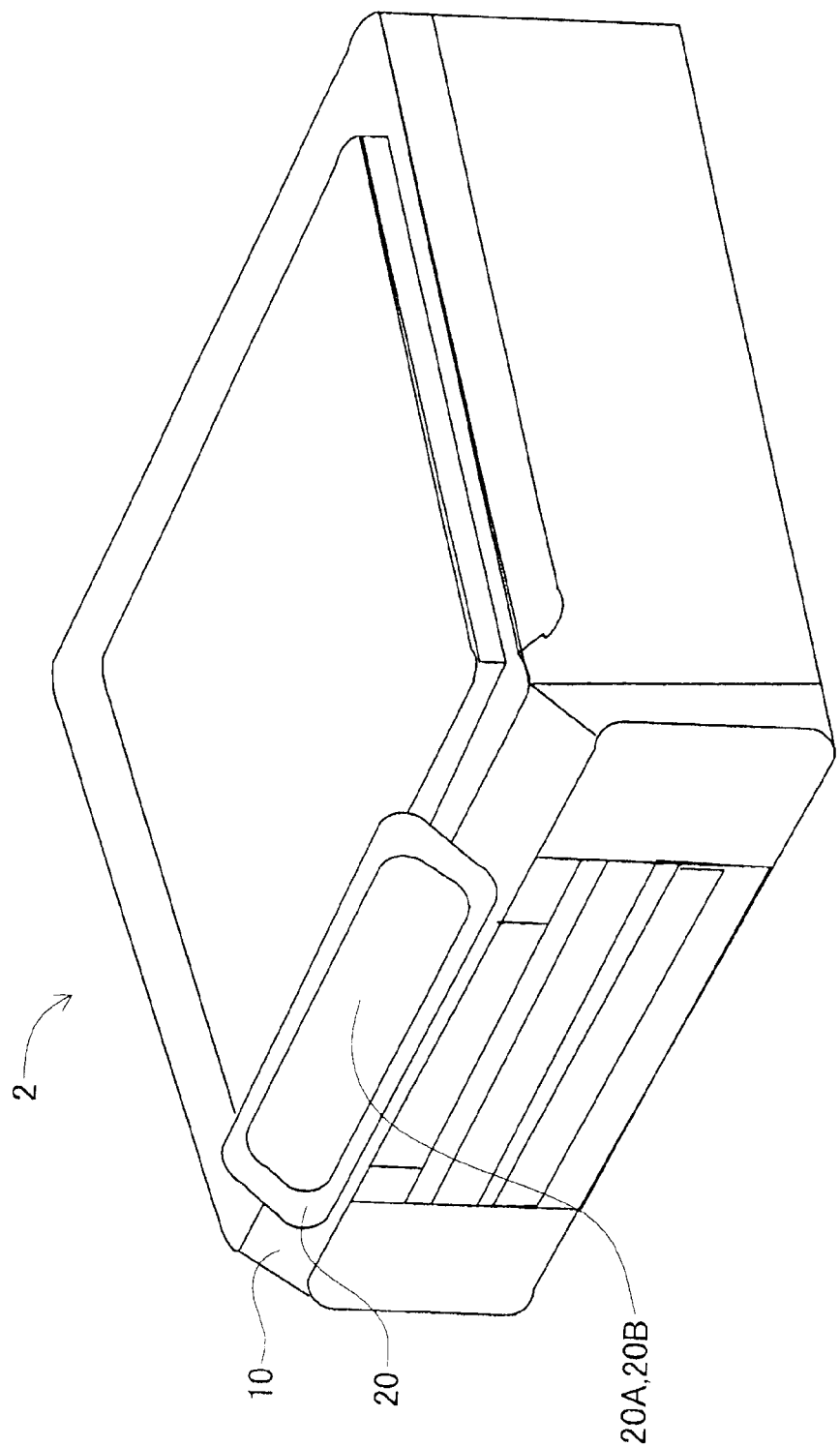
FIG. 1 is a perspective view of a multifunction peripheral device (MFP) according to an embodiment of the present invention.
Figure 2:
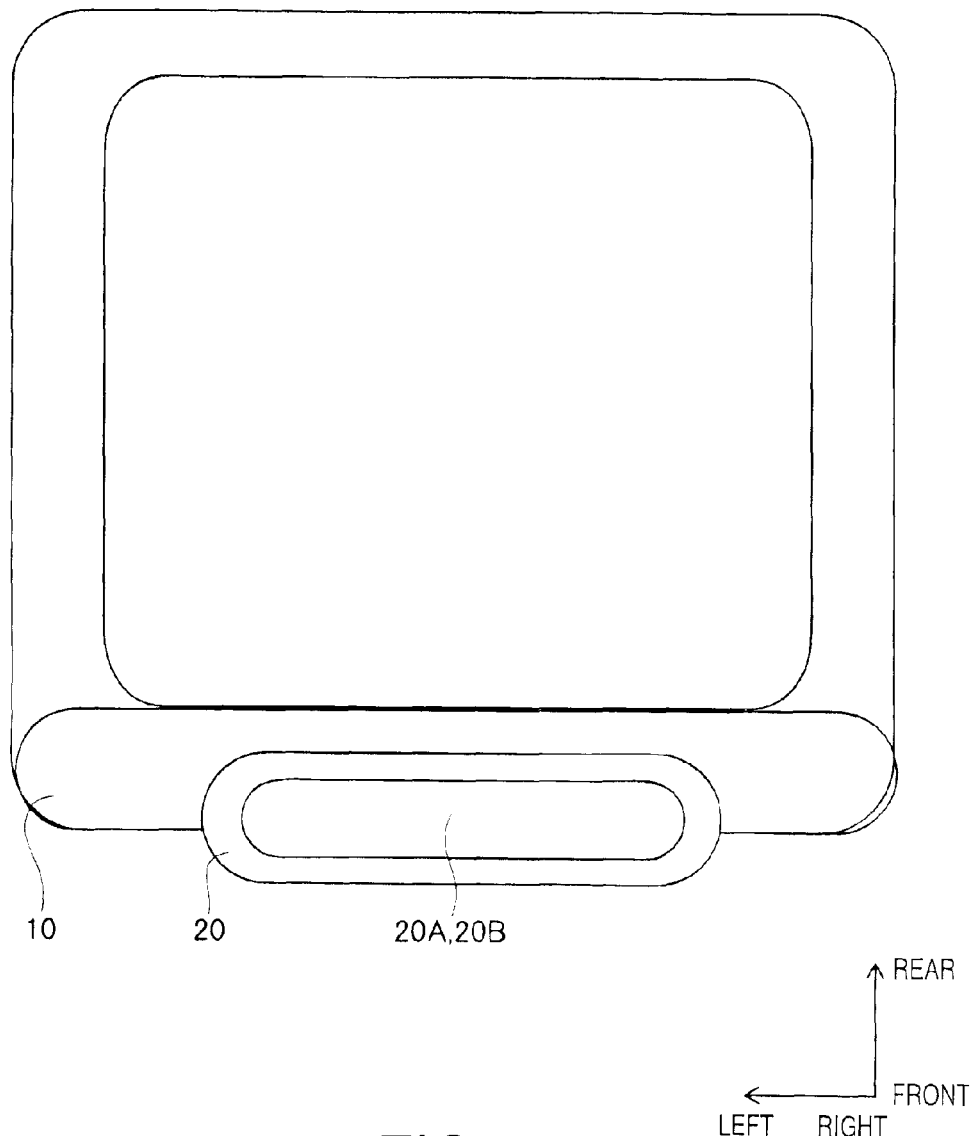
FIG. 2 is a plane view of the MFP according to the embodiment of the present invention.
Figure 3:
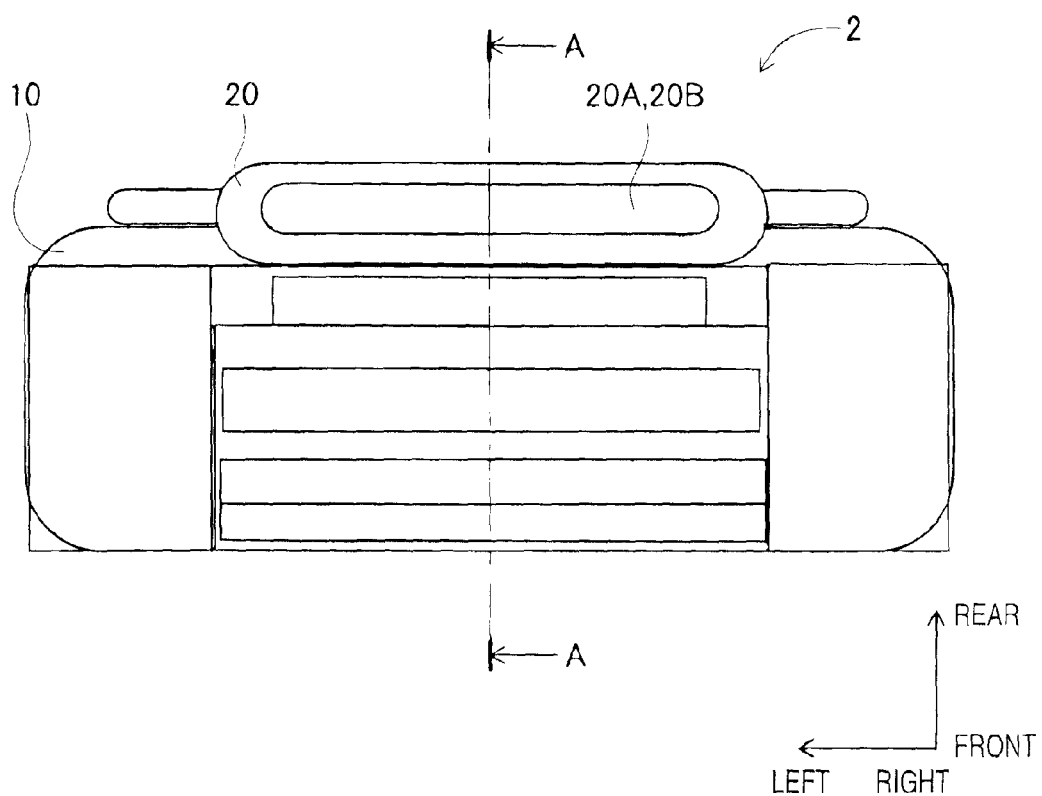
FIG. 3 is a front view of the MFP according to the embodiment of the present invention.
Figure 4:
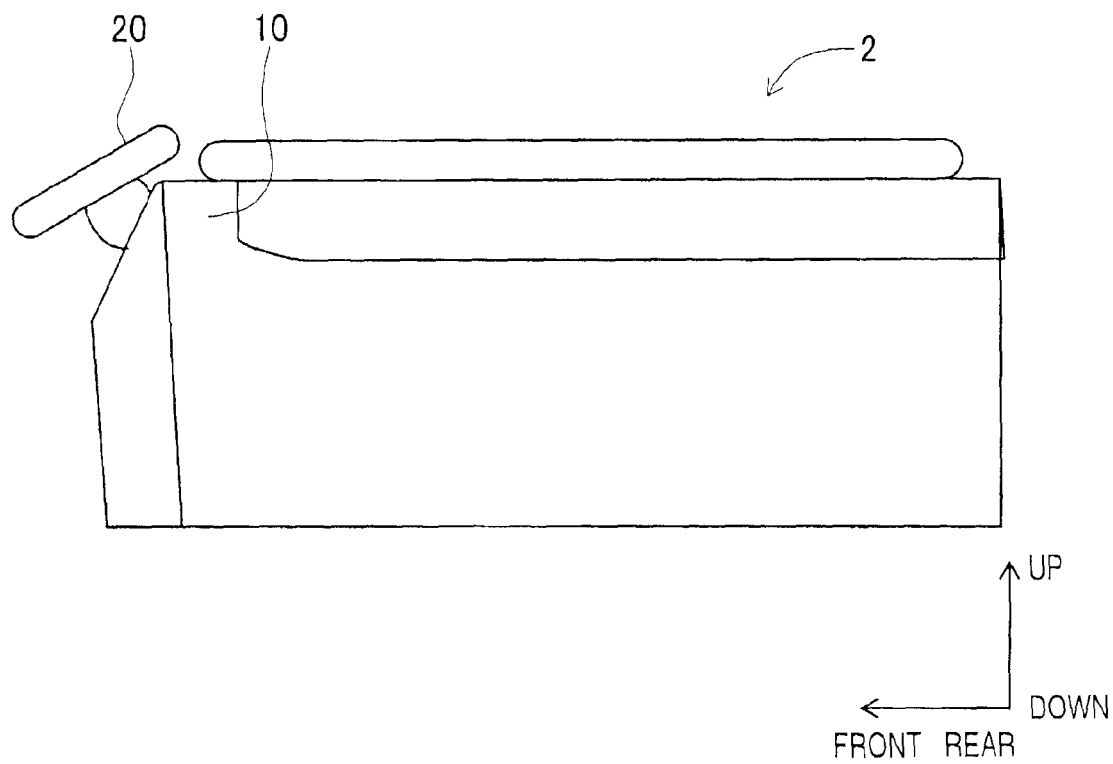
FIG. 4 is a side view of the MFP according to the embodiment of the present invention.
Figure 5:
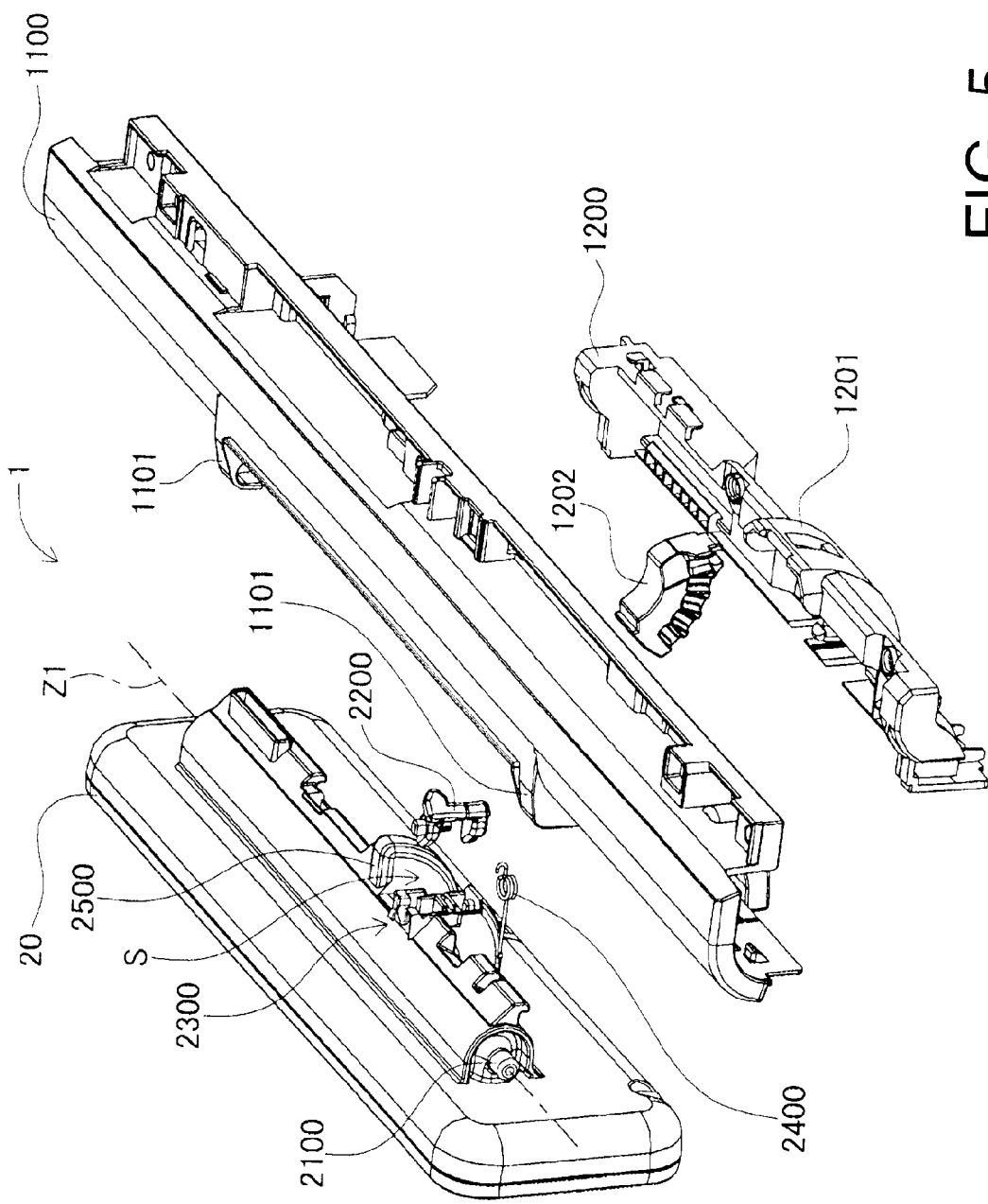
FIG. 5 is an exploded view of a tilt assembly in the MFP according to the embodiment of the present invention.

As depicted in FIG. 5, the tilt assembly 1 is an assembly of a plurality of parts including the panel body 20, a first on-body part 1100, a second on-body part 1200, an engagement piece 1202, a engaging piece 2200, and a torsion coil spring 2400. The panel body 20 includes shafts 2100, a support portion 2300, and an engagement piece support 2500. The shafts 2100 are parts of a rod, about which the panel body 20 rotates, and a central axis of the shafts 2100 coincides with a rotation axis Z1 of the panel body 20. In other words, the panel body 20 is rotatable about the rotation axis Z1. On the support portion 2300 of the panel body 20, as will be described later in detail, the engaging piece 2200 and the torsion coil spring 2400 are mounted. The first on-body part 1100 is mounted on the body 10 and includes a pair of bearings 1101. The second on-body part 1200 is mounted on the first on-body part 1100 and includes an attachable portion 1201. On the attachable portion 1201 of the second on-body part 1200, the engagement piece 1202 is attached. Therefore, among the parts within the tilt assembly 1 described above, the engaging piece 2200 and the torsion coil spring 2400 are mounted on the panel body 20 while the first on-body part 1100, the second on-body part 1200, the engagement piece 1202 are mounted on the main body 10 of the MFP 2.

In this tilt assembly 1, the shafts 2100 formed in the panel body 20 are inserted in the bearings 1101 formed in the first on-body part 1100. Thereby, the panel body 20 is rotatably attached to the main body 10 to rotate about the rotation axis Z1.

In a position between the support portion 2300 and the engagement piece support 2500 in the panel body 20, space S is reserved. When the tilt assembly 1 is completely set up, the space S is occupied by the engagement piece 1202.

The shafts 2100 (in this paragraph only, the term "the shafts 2100" includes the engaging piece 2200, the support portion 2300, the torsion coil spring 2400, and the engagement piece support 2500) and their mating structure, which are the paired bearings 1101 formed in the first on-body part 1100 and the engagement piece 1202 to be attached to the second on-body part 1200, may be replaced with each other. In other words, "the shafts 2100" may be formed in the first on-body part 1100, while the paired bearings 1101 may be formed in the panel body 20 and the engagement piece 1202 may be attached to the panel body 20. When the engagement piece 1202 is attached to the panel body 20, the second on-body part 1200 may be omitted.

Figure 6:
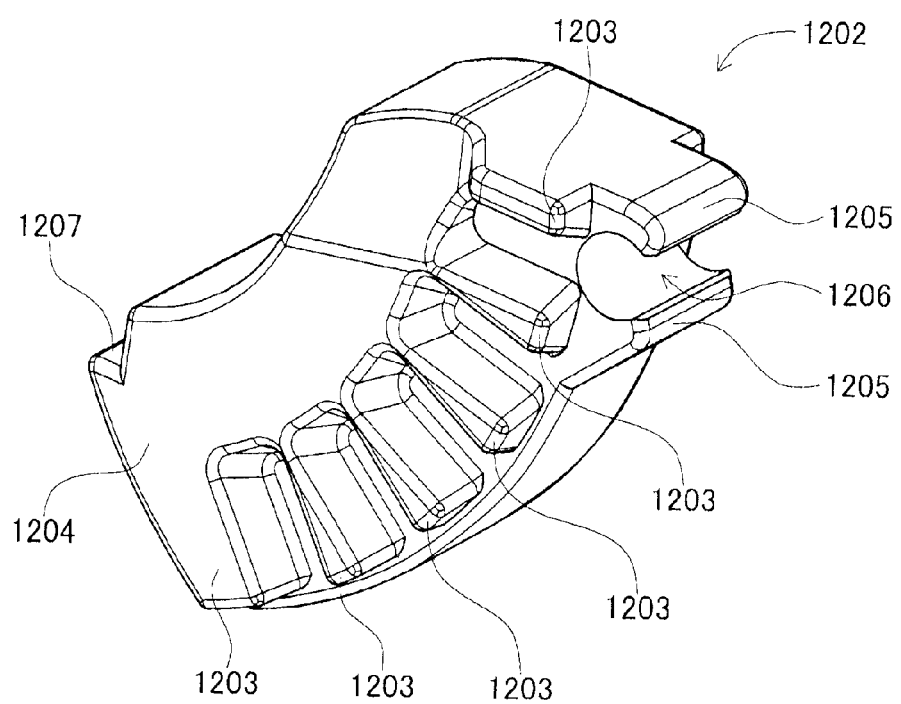
FIG. 6 is a perspective view of an engagement piece in the tilt assembly in the MFP according to the embodiment of the present invention.
Figure 7:
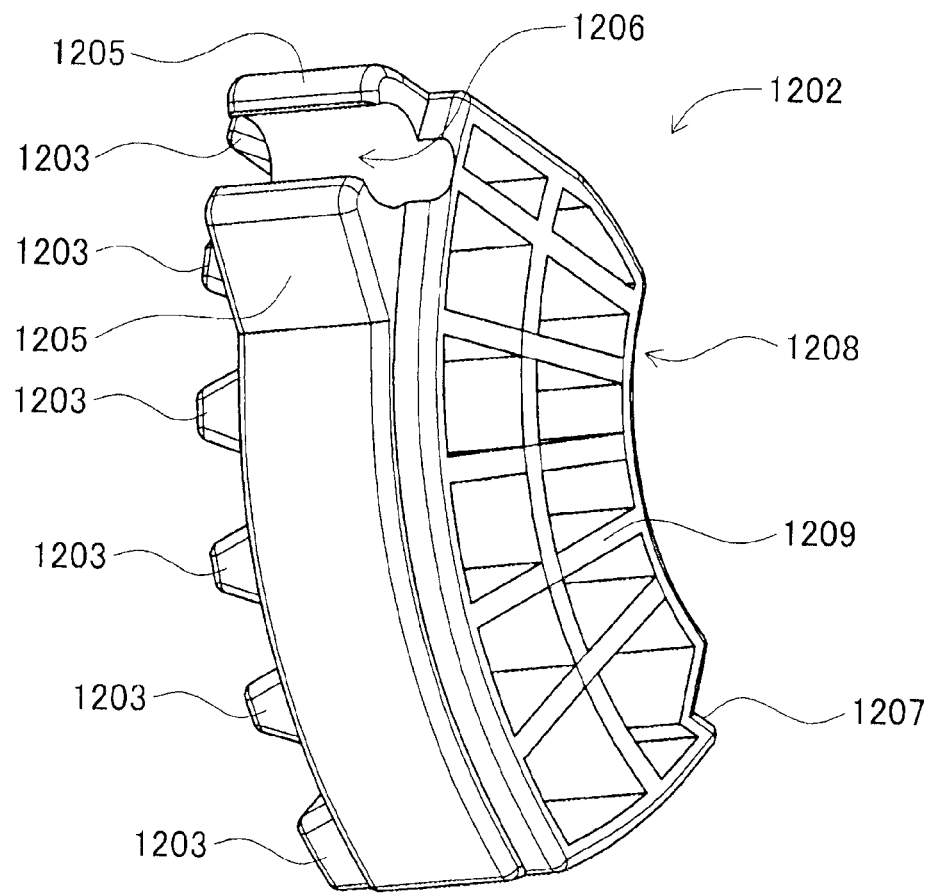
FIG. 7 is a perspective view of the engagement piece in the tilt assembly in the MFP according to the embodiment of the present invention.

As depicted in FIGS. 6-7, the engagement piece 1202 has an obverse side 1204 and a reverse side 1208, which is opposite from the obverse side 1204. When the engagement piece 1202 is attached to the main body 10 via the second on-body part 1200, the obverse side 1204 and the reverse side 1208 are orthogonal with respect to the rotation axis Z1. On the obverse side 1204, six (6) teeth 1203 are formed. Further, as depicted in FIG. 9, the six teeth 1203 are formed by carving five (5) grooves 1203C on the obverse side 1204 of the engagement piece 1202 so that the teeth 1203 relatively jut from bottoms of the grooves 1203C.

Figure 8:
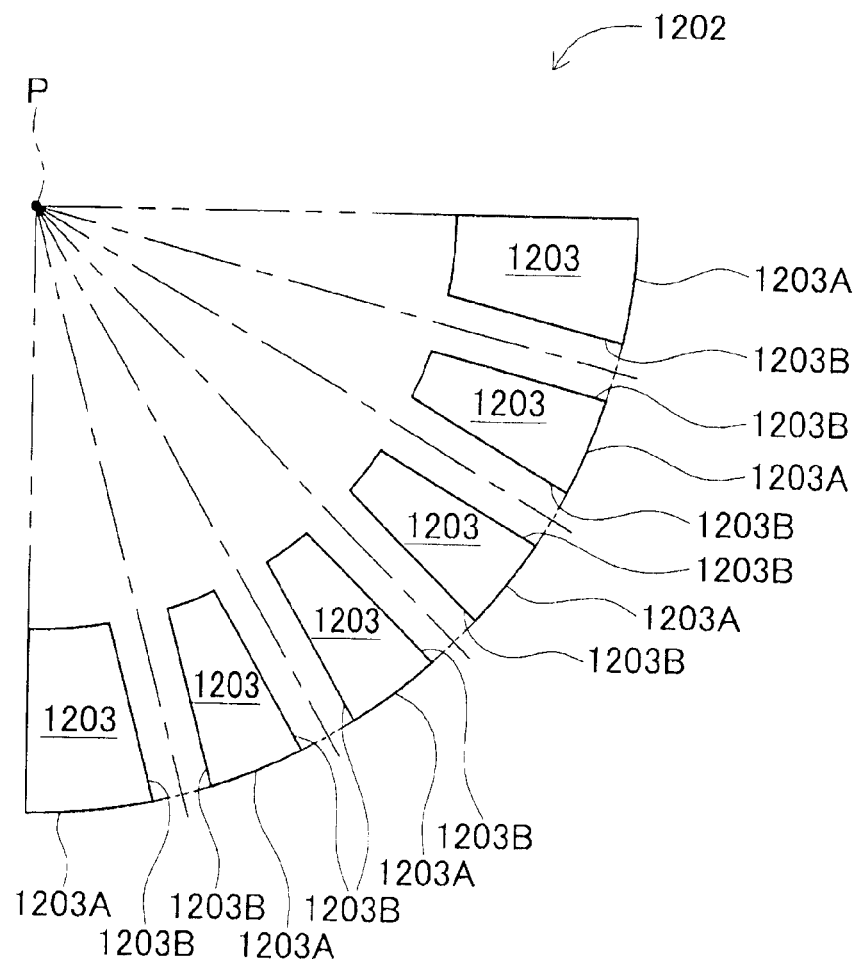
FIG. 8 is an illustrative view of the engagement piece in the tilt assembly in the MFP according to the embodiment of the present invention.
Figure 9:
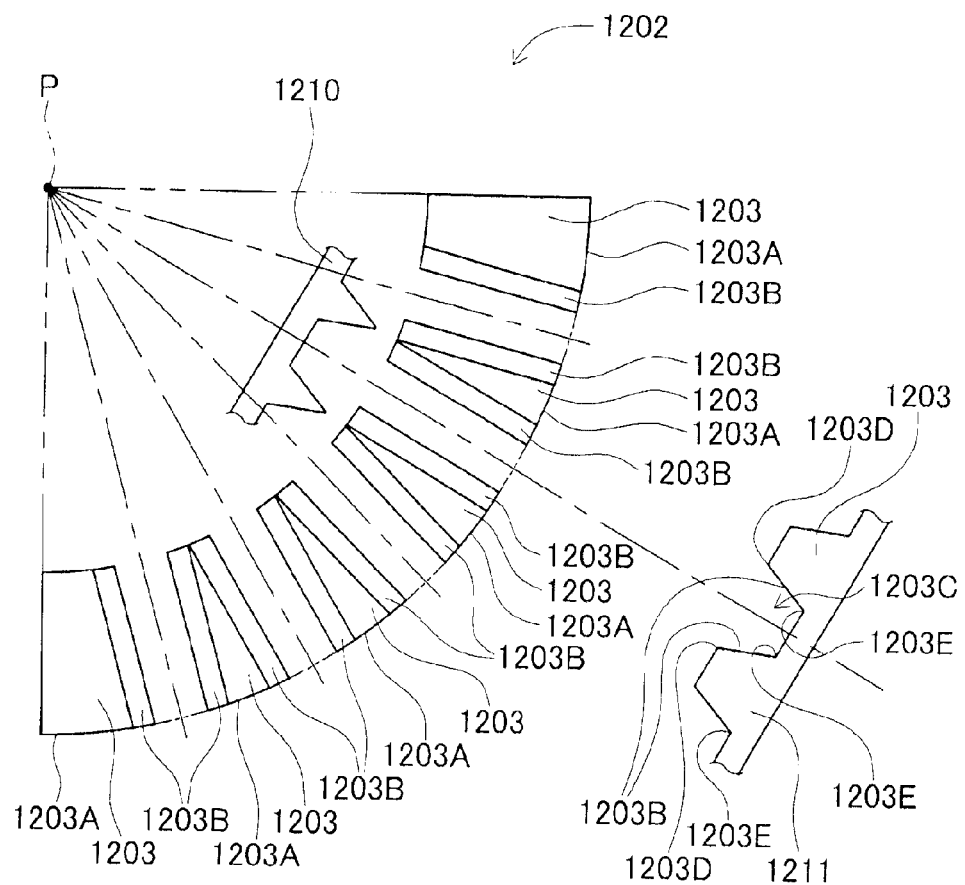
FIG. 9 is an illustrative view of the engagement piece in the tilt assembly in the MFP according to the embodiment of the present invention.

Further, as depicted in FIGS. 8-9, due to a shape of each jut 1203A of the teeth 1203, engagement piece 1202 is formed in a shape of a sector centered on a point P.

In other words, in the engagement piece 1202, the teeth 1203 are formed in the sectorial arrangement centered on the point P to orient from outside toward inside along radial directions. A shape of each groove 1203C formed in between two adjoining teeth 1203 are constant along the radial direction of the sector. Namely, a cross-sectional shape of the groove 1203C at a cross section 1210 closer to the point P and a cross-sectional shape of the groove 1203C at a cross section 1211 farther from the point P are identical. Therefore, upper edges 1203D of adjoining slope 1203B in two adjoining teeth 1203 extend in parallel with each other. Further, lower edges 1203E of the two adjoining slope 1203B in the two adjoining teeth 1203 extend in parallel with each other. When the tilt assembly 1 is completely set up, the six teeth 1203 are arranged at a predetermined interval from one another along a circumference centered on the rotation axis Z1 on a virtual plane, which spreads orthogonally with respect to the rotation axis Z1.

The engagement piece 1202 is formed to have two (2) projections 1205 on an outer side with respect to one of the teeth 1203 in an uppermost position shown in FIGS. 6-7. In between the two projections 1205, an insertion hollow 1206 is formed. Meanwhile, in an opposite position from the insertion hollow 1206 within the engagement piece 1202, across the teeth 1203 and the obverse side 1204, a step-shaped interlocking portion 1207 is formed.

On the reverse side 1208 of the engagement piece 1202, a plurality of ribs 1209 are formed in grid. The ribs 1209 divide the reverse side 1208 of the engagement piece 1202 into a plurality of areas. On the reverse side 1208 of the engagement piece 1202, a resilient member 2600 (see FIG. 26), which will be described later, may be attached.

Figure 10:
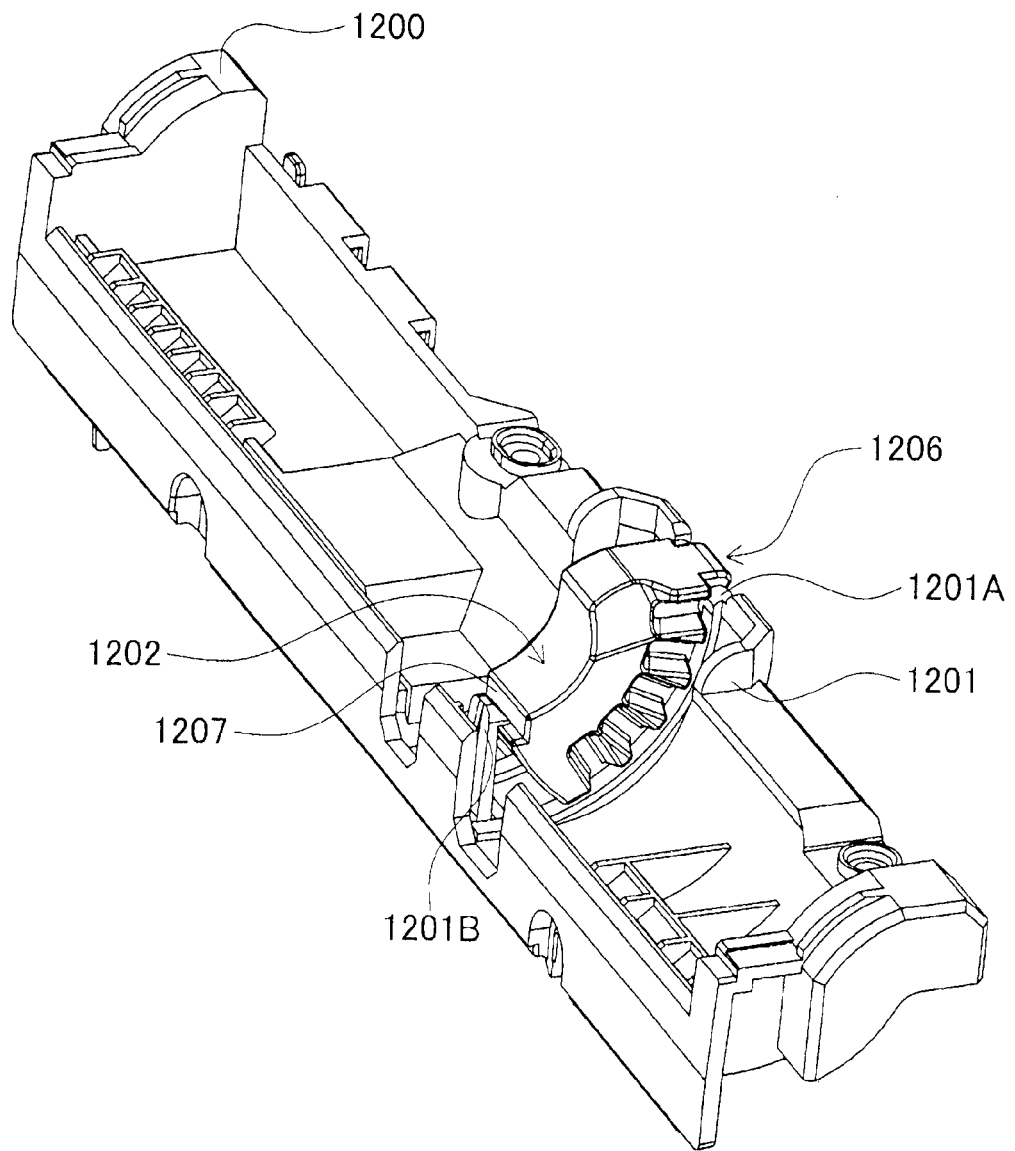
FIG. 10 is a perspective view of a second on-body part with the engagement piece in the tilt assembly in the MFP according to the embodiment of the present invention.

As depicted in FIG. 10, the attachable portion 1201 in the second on-body part 1200 is formed to have a rod 1201A and a locking claw 1201B. In order to attach the engagement piece 1202 to the attachable portion 1201, firstly, the insertion hollow 1206 of the engagement piece 1202 is pressed to the rod 1201 of the attachment part 1201 to be fitted around the rod 1201. Secondly, the engagement piece 1202 is rotated with respect to the attachable portion 1201 about the rod 1201A. Thirdly, the interlocking portion 1207 of the engagement piece 1202 is meshed with the locking claw 1201B of the attachable portion 1201. Thus, the engagement piece 1202 is fixedly attached to the attachable portion 1201.

Figure 11:
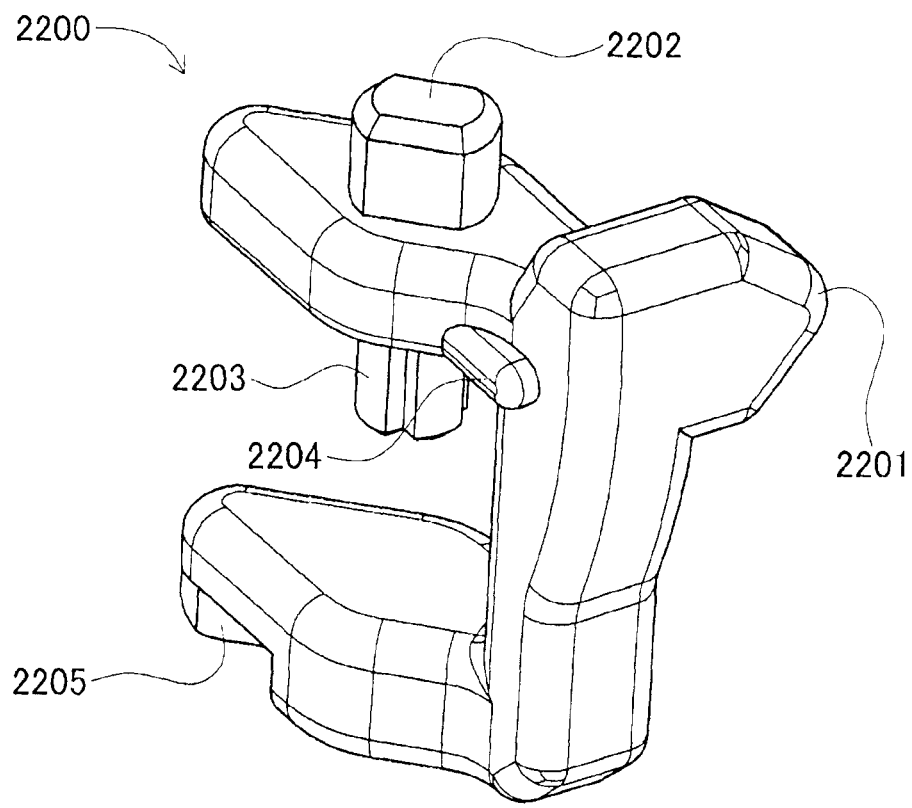
FIG. 11 is a perspective view of an engaging piece in the tilt assembly in the MFP according to the embodiment of the present invention.
Figure 12:
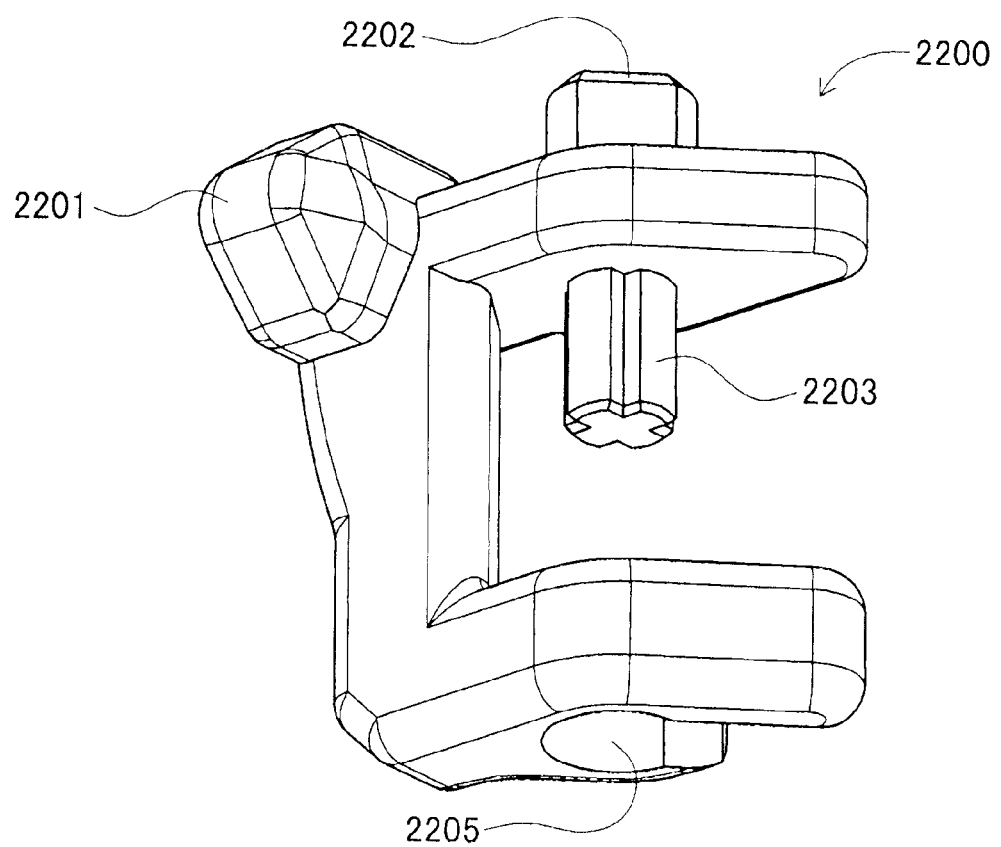
FIG. 12 is a perspective view of the engaging piece in the tilt assembly in the MFP according to the embodiment of the present invention.
Figure 13:
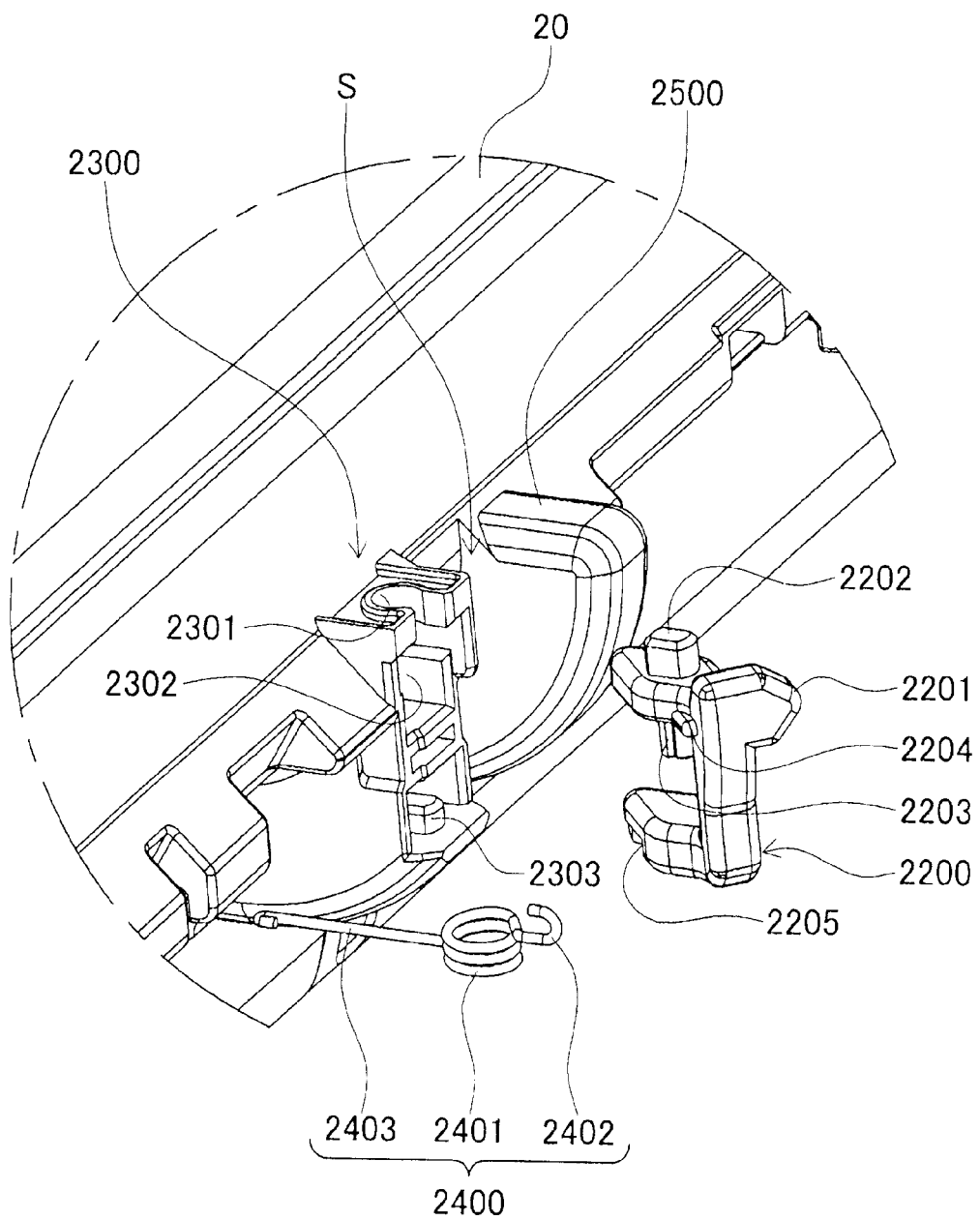
FIG. 13 is a perspective view of the tilt assembly including a support portion in a panel body of a panel device and the engaging piece in the MFP according to the embodiment of the present invention.

As depicted in FIGS. 11-12, the engaging piece 2200 includes a tooth-like wedge claw 2201, an upper rotation shaft 2202, a coil core 2203, a latch bar 2204, and a lower rotatable hollow 2205. Meanwhile, as depicted in FIG. 13, the support portion 2300 in the panel body 20 includes an upper rotatable hollow 2301, a spring chamber 2302, and a lower rotation shaft 2303.

In the present embodiment, the support portion 2300 is formed in a shaft member 2100A (see FIGS. 21A-21B), which will be described later, and the engaging piece 2200 is rotatably attached to the support portion 2300 of the panel body 20. In this regard, the torsion coil spring 2400 is attached to the engaging piece 2200. As depicted in FIG. 13, the torsion coil spring 2400 includes a coil 2401, a short hook 2402, and a guide bar 2403.

Figure 14:
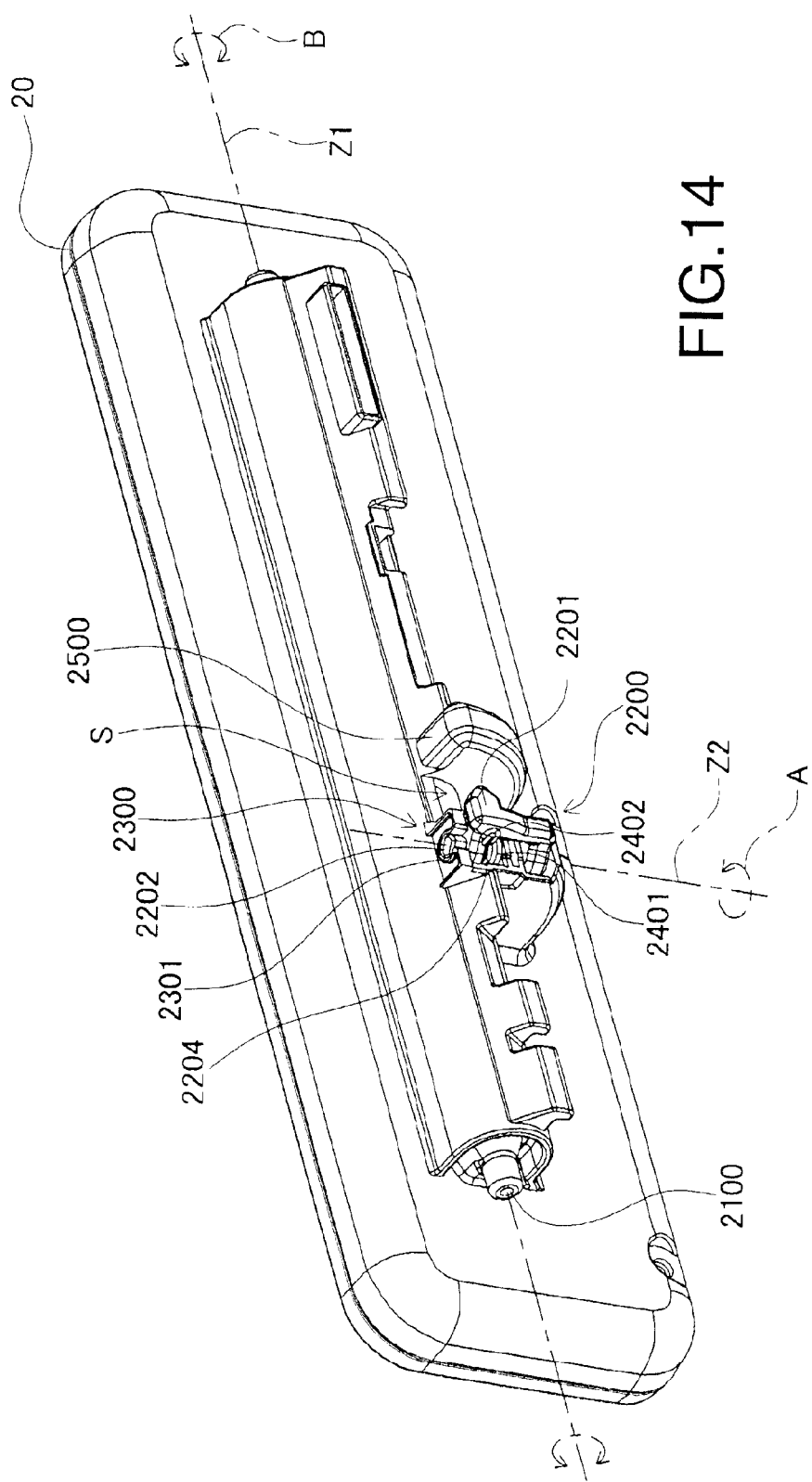
FIG. 14 is a perspective view of the panel device in the MFP according to the embodiment of the present invention.

As depicted in FIG. 14, the coil core 2203 is inserted in loops of the coil 2401 of the torsion coil spring 2400. Meanwhile, the short hook 2402 of the torsion coil spring 2400 is hooked to the latch bar 2204.

Thereafter, the guide bar 2403 of the torsion coil spring 2400 is inserted in the spring chamber 2302 of the support portion 2300 (see FIG. 13), and the upper rotation shaft 2202 of the engaging piece 2200 is inserted in the upper rotatable hollow 2301 of the support portion 2300 (see FIG. 14). Further, the lower rotation shaft 2303 of the support portion 2300 is inserted in the lower rotatable hollow 2205 of the engaging piece 2200 (see FIGS. 13-14). Thus, the engaging piece 2200 is rotatably attached to the support portion 2300 of the panel body 20.

With the engaging piece 2200 rotatably attached to the support portion 2300 of the panel body 20, the wedge claw 2201 of the engaging piece 2200 is rotatably supported to rotate about an axis Z2 (see FIG. 14), about which the engaging piece 2200 rotates.

Figure 16:
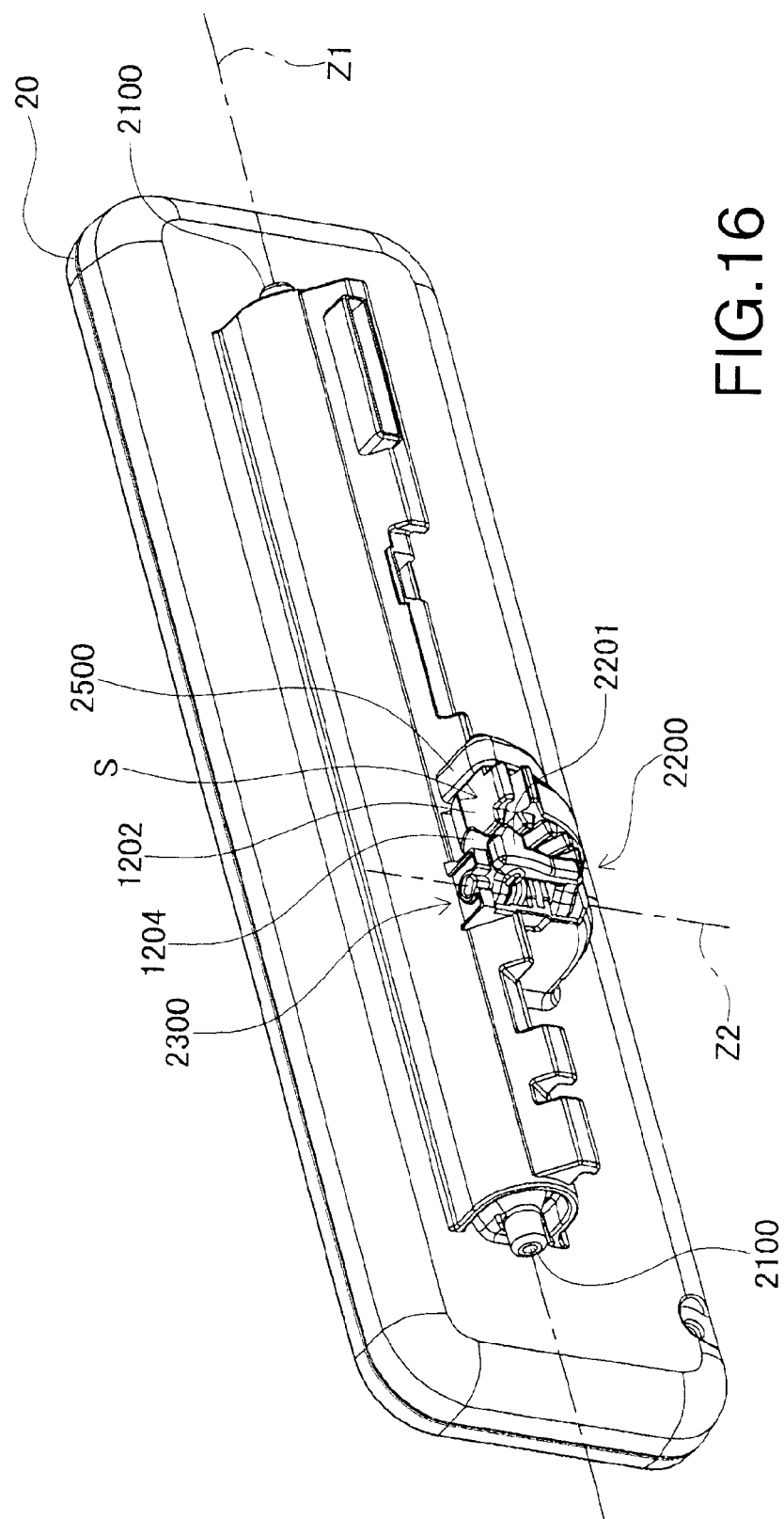
FIG. 16 is a perspective view of the tilt assembly including the panel body and the engagement piece to be attached to a main body of the MFP according to the embodiment of the present invention.

The torsion coil spring 2400 provides force to rotate the engaging piece 2200 in a direction indicated by an arrow A (see FIG. 14) about the axis Z2 and urges the wedge claw 2201 against the engagement piece 1202 (see FIG. 16).

Figure 15:
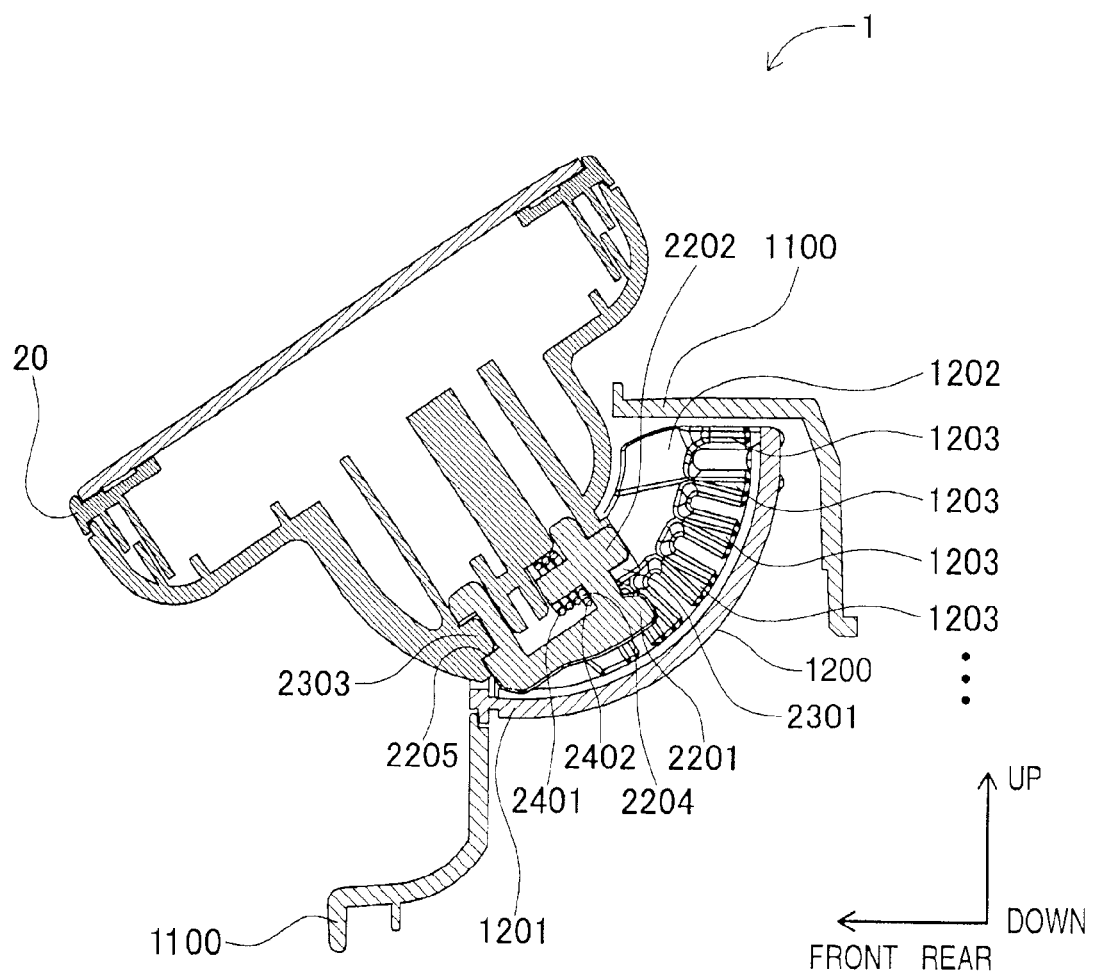
FIG. 15 is a cross-sectional partial view of the MFP according to the embodiment of the present invention taken along a line A-A shown in FIG. 3.

When the shafts 2100 formed in the panel body 20 are inserted in the bearings 1101 of the first on-body part 1100, the panel body 20 is rotatably supported by the main body 10 to rotate with respect to the main body 10. Thereafter, when the second on-body part 1200 is attached to the first on-body part 1100, the tilt assembly 1 is achieved. In this regard, as depicted in FIG. 15, the engagement piece 1202 is disposed in a rearward position with respect to a front end portion of the first on-body part 1100, which is closer to the panel body 20. Therefore, the engagement piece 1202 is not exposed to the outer side of the first on-body part 1100. Accordingly, when the panel body 20 is moved to be tilted, the engagement piece 1202 can be kept away from a foreign substance and prevented from being interfered with by the foreign substance. In other words, an error which may be caused by the foreign substance caught in the grooves 1203C formed in the engagement piece 1202 may be prevented. When the tilt assembly 1 is achieved, as has been mentioned above, the teeth 1203 in the engagement piece 1202 are arranged in the sectorial form spreading about the rotation axis Z1, which coincides with the central axis of the shafts 2100, along the circumference (see FIGS. 15-16).

As depicted in FIGS. 1-4, in the MFP 2, when a user adjusts a tilt angle of the panel body 20 with respect to the main body 10, the user rotates the panel body 20 about the shafts 2100 (or about the rotation axis Z1). In this regard, as mentioned above, the wedge claw 2201 of the engaging piece 2200, which is attached to the panel body 20, is urged against the engagement piece 1202 attached to the main body 10 by the force of the torsion coil spring 2400. Therefore, when the user rotates the panel body 20 about the shafts 2100 (or the rotation axis Z1), the wedge claw 2201 of the engaging piece 2200 rotates about the axis Z2 tracing edges of the teeth 1203 formed in the engagement piece 1202, which is attached to the main body 10.

When the user stops rotating the panel body 20, the wedge claw 2201 of the engaging piece 2200 on the panel body 20 is engaged with one of the grooves 1203C formed in between the teeth 1203 in the engagement piece 1202 on the main body 10. Each of the grooves 1203C is, as denoted by reference signs 1210, 1211 in FIG. 9, formed to have slopes, which are symmetrical with respect to the radial direction. Meanwhile, the wedge claw 2201 is formed to be in surface contact with the slopes to be engaged in the groove 1203C between the teeth 1203. Therefore, when the user stops rotating the panel body 20, the wedge claw 2201 fits in one of the grooves 1203 steadily to be engaged with the adjoining teeth 1203, and the tilted posture of the panel body 20 with respect to the main body 10 is maintained. Thus, the tilted posture of the panel body 20 with respect to the main body 10 can be suitably adjusted by the user.

In the tilt assembly 1 according to the present embodiment, the panel body 20 is rotatably attached to the main body 10 to rotate about the rotation axis Z1, while the wedge claw 2201 of the engaging piece 2200 supported on the panel body 20 is urged against one of the six teeth 1203 in the engagement piece 1202, which is attached to the main body 10, by the torsion coil spring 2400 along the rotation direction A about the rotation axis Z2. With this configuration, when the user adjusts the tilt angle of the panel body 20 with respect to the main body 10, deformation of the panel body 20 can be prevented, and operational load to rotate the panel can be stabilized.

That is, while the wedge claw 2201 is moved by the torsion coil spring 2400 along the direction A, the direction A to urge the engaging piece 2200 on the panel body 20 is substantially linear and in parallel with the longitudinal direction of the panel body 20 within a movable range of the wedge claw 2201. Therefore, the panel body 20 is prevented from being twisted, and deformation of the panel body 20 can be restricted.

Next, configuration to move the tilt assembly 1 will be described with reference to FIGS. 18-21. In order to simplify the explanation, in the following description, the panel body 20 can be tilted with respect to the main body 10 and maintained at one of three positions 20X, 20Y and 20Z, instead of one of six positions corresponding to the six grooves 1203C in the engagement piece 1202.

As depicted in FIGS. 20A-20B, within the tilt assembly 1, parts to be attached to the main body 10 include the first on-body part 1100 and the second on-body part 1200. As mentioned above, the first on-body part 1100 includes the paired bearings 1101. Meanwhile, the engagement piece 1202 is attached to the second on-body part 1200. When the first on-body part 1100 and the second on-body part 1200 are attached together, the paired bearings 1101 are disposed in inward positions with respect to longitudinal ends of the first on-body part 1100, while the engagement piece 1202 is disposed in a substantially central position between the longitudinal ends of the first on-body part 1100.

As mentioned above, in the engagement piece 1202, the plurality of grooves are formed to align in the sectorial arrangement about the shafts 1101 along the circumference. In FIG. 20B, for convenience of the explanation, only three (3) grooves 1203X, 1203Y and 1203Z are shown unlike the embodiment mentioned above.

Figures 21A, 21B:
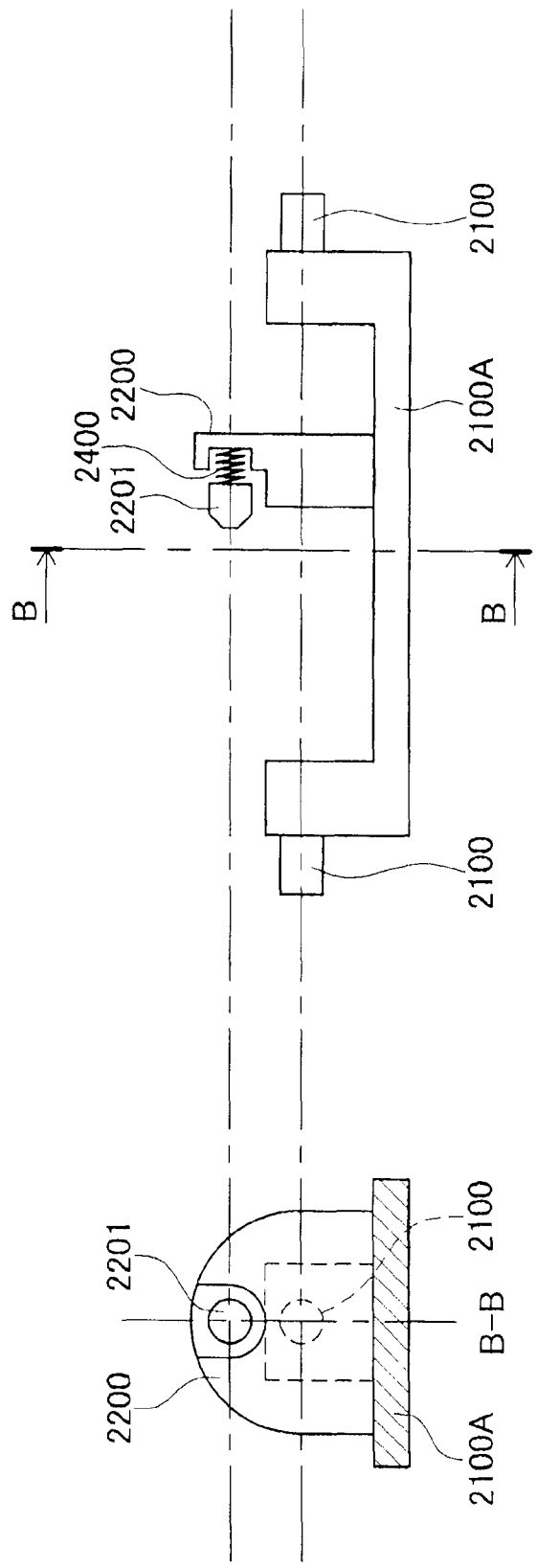
FIG. 21A is an illustrative cross-sectional view of a part of the tilt assembly on the panel body in the MFP according to the embodiment of the present invention taken along a line B-B shown in FIG. 21B.
FIG. 21B is an illustrative plane view of the part of the tilt assembly on the panel body in the MFP according to the embodiment of the present invention.

Meanwhile, as depicted in FIGS. 21A-21B, within the tilt assembly 1, parts to be attached to the panel body 20 include a shaft member 2100A. The shaft member 2100A is a piece having the paired shafts 2100, which protrude outward from at longitudinal ends of the shaft member 2100A. At a longitudinal central position in the shaft member 2100A, as mentioned above, the engaging piece 2200 is attached to the shaft member 2100A via the support portion 2300, which is omitted in FIGS. 21A-21B. At a tip end portion of the engaging piece 220, the wedge claw 2201 to be urged toward the longitudinal central position in the shaft member 2100A by the torsion coil spring 2400 is arranged. In the present embodiment, solely one wedge claw 2201 is provided.

As depicted in FIGS. 18A-18B, 19A-19B, when the paired shafts 2100 in the panel body 20 are inserted in the paired bearings 1101 in the main body 10 respectively, the panel body 20 becomes rotatably attached to the main body 10 to rotate about the main body 10.

As depicted in FIGS. 18A-18B, when the panel body 20 rotates with respect to the main body 10 and is maintained at one of the positions 20X, 20Y and 20Z, the wedge claw 2201 urged by the torsion coil spring 2400 is placed in one of positions 2201X, 2201Y and 2201Z respectively. In other words, the wedge claw 2201 on the panel body 20 is placed in one of the three grooves 1203X, 1203Y and 1203Z between the teeth 1203 formed in the engagement piece 1202, which is mounted on the main body 10. In this regard, while the wedge claw 2201 is urged against the engagement piece 1202 by the torsion coil spring 2400, the wedge claw 2201 fits in the one of the three grooves 1203X, 1203Y and 1203Z steadily. Thus, the tilt angle of the panel body 20 with respect to the main body 10 can be maintained at the position.

More specifically, as depicted in FIGS. 18A-18B, when the panel body 20 is tilted to be in the position 20X, the wedge claw 2201 on the panel body 20 is placed in the position 2201X. In this regard, the wedge claw 2201 fits in the groove 1203X (see FIG. 20B). When the panel body 20 is tilted to be in the position 20Y, the wedge claw 2201 on the panel body 20 is placed in the position 2201Y. In this regard, the wedge claw 2201 fits in the groove 1203Y (see FIG. 20B). When the panel body 20 is tilted to be in the position 20Z, the wedge claw 2201 on the panel body 20 is placed in the position 2201Z. In this regard, the wedge claw 2201 fits in the groove 1203Z (see FIG. 20B).

According to the configuration of the tilt assembly 1 described above, when the panel body 20 is moved to one of the positions 20X, 20Y and 20Z, the wedge claw 2201 is placed to one of the positions 2201X, 2201Y and 2201Z, and the wedge claw 2201 fits in one of the grooves 1203X, 1203Y and 1203Z. Thus, the user can adjust the tilt angle of the panel body 20 with respect to the main body 10 and maintain the angle steadily. Further, the configuration can provide effective operability to the user; that is, with the configuration, the user can sense clicking impact from the wedge claw 2201 tracing along the grooves 1203X, 1203Y and 1203Z via the panel body 20 to know that the panel body 20 is rotated securely with respect to the main body 10.

Further, as mentioned above, the torsion coil spring 2400 to urge the wedge claw 2201 is mounted on the panel body 20.

In particular, as depicted in FIGS. 18A-18B, 19A-19B, the direction to urge the wedge claw 2201 by the torsion coil spring 2400 is substantially in parallel with the rotation axis Z1 of the paired shafts 2100, which are inserted in the paired bearings 1101 in the main body 10. Meanwhile, when the user adjusts the tilt angle of the panel body 20 with respect to the main body 10, the torsion coil spring 2400 and the wedge claw 2201 rotate about the rotation axis Z1. In this regard, the wedge claw 2201 repeats entering and exiting the grooves 103X, 1203Y and 1203Z one after another. In other words, when the tilt angle of the panel body 20 is adjusted, the wedge claw 2201 being urged against the engagement piece 1202 by the torsion coil spring 2400 reciprocates linearly in parallel with the rotation axis Z1 of the panel body 20. Therefore, while the urging force from the torsion coil spring 2400 may affect the main body 10 via the engagement piece 1202, impact by the urging force applied to the panel body 20 may be smaller. Thus, deformation of the panel body 20 due to the urging force from the tilting motion may be prevented.

In the tilt assembly 1 according to the embodiment, it may not be necessary that the engagement piece 1202 is formed to have the grooves 1203. More specifically, the tilt angle of the panel body 20 with respect to the main body 10 may be adjusted even without any groove 1203 formed in the engagement piece 1202. That is, for example, the engagement piece 1202 may be replaced with a break disc, and the wedge claw 220 may be replaced with a break shoe urged by the torsion coil spring 2400. With the break disc and the break show functioning as a disc break, the tilt angle of the panel body 20 with respect to the main body 10 may be controlled by friction force produced in between the break disc and the break shoe.

In the tilt assembly 1 according to the embodiment, the wedge claw 2201 is rotatably supported via the engaging piece 2200 to rotate about the axis Z2. The axis Z2 extends orthogonally with respect to the rotation axis Z1 of the panel body 20 in a position apart from the rotation axis Z1 for a predetermined first distance. In this arrangement, rather than having the wedge claw 2201 rotatable about a rotation axis closer to the rotation axis Z1, it is easier to configure the engaging piece 2200 being urged against the engagement piece 1202 to have the wedge claw 2201 fit in one of the grooves 1203.

However, although it is not shown in the drawings, the axis Z2 may not necessarily be arranged in the separated position from the rotation axis Z1 for the predetermined first distance as long as the axis Z2 extends orthogonally with respect to the rotation axis Z1. Even in this arrangement, it is possible to configure the engaging piece 2200 urged against the engagement piece 1202 to have the wedge claw 2201 fit in one of the grooves 1203.

In the tilt assembly 1 according to the embodiment, in the engagement piece 1202, at least four (4) teeth 1203 among the six teeth 1203, which are on an inner side along the circumference of the engagement piece 1202, are formed in the sectorial arrangement centered on the rotation axis Z1 from outside toward inside along the radial directions. In this regard, the upper edges 1203D of two adjoining juts 1203A extend in parallel with each other. Further, the lower edges 1203E of the two adjoining juts 1203A extend in parallel with each other. With this configuration, while the wedge claw 2201 of the engaging piece 220 is urged against the engagement piece 1202 to trace over the teeth 1203 along the rotating direction B about the rotation axis Z1, friction force is produced in between the wedge claw 2201 and the juts 1203A of the teeth 1203. In this regard, the friction force is distributed in surfaces of the wedge claw 2201 contacting the slopes 1203B of the juts 1203. Thus, the panel body 20 can be easily moved to tilt with respect to the main body 10.

More specifically, when the panel body 20 is moved with respect to the main body 10, in the tilt assembly 1, the wedge claw 2201 of the engaging piece 2200 attached to the panel body 20 fits in the grooves 1203C formed in between the teeth 1203 one after another sequentially. In this regard, heaviness or lightness of the load required to move the panel body 20 may depend on the shape of the teeth 1203 and/or the shape of the wedge claw 2201. Therefore, in order to stabilize the load for the user to move the panel body 20, the shape of the teeth 1203 in the engagement piece 1202 and/or the shape of the wedge claw 2201 in the engaging piece 2200 may be adjusted prior to installing the tilt assembly 1 in the MFP 2.

In this regard, if heaviness or lightness of the load to move the panel body 20 should be adjusted by the characteristics of the wedge claw 2201 in the engaging piece 2200, the wedge claw 2201 may be configured to be higher in anti-wear quality than the teeth 1203 so that the panel body 20 may be smoothly moved with respect to the main body 10 by the user.

On the other hand, if heaviness or lightness of the load to move the panel body 20 should be adjusted by the characteristics of the teeth 1203 in the engagement piece 1202, the teeth 1203 may be configured to be higher in the anti-wear quality than the wedge claw 2201 so that the panel body 20 may be smoothly moved with respect to the main body 10 by the user.

In the tilt assembly 1 according to the embodiment, the engagement piece support 2500 may be disposed on the panel body 20 in the position apart from the engaging piece 2200 across the space S along the rotation axis Z1 to support the engagement piece 1200. Therefore, when the wedge claw 2201 of the engaging piece 220 is urged against the engagement piece 1202, the engagement piece 1202 can be prevented from being deformed toward the urging direction by the force from the wedge claw 2201. Thus, the positions of the engagement piece 1202 and the engaging piece 2200 can be steadily maintained, and the load to move the panel body 20 may be stabilized.

Figure 17:
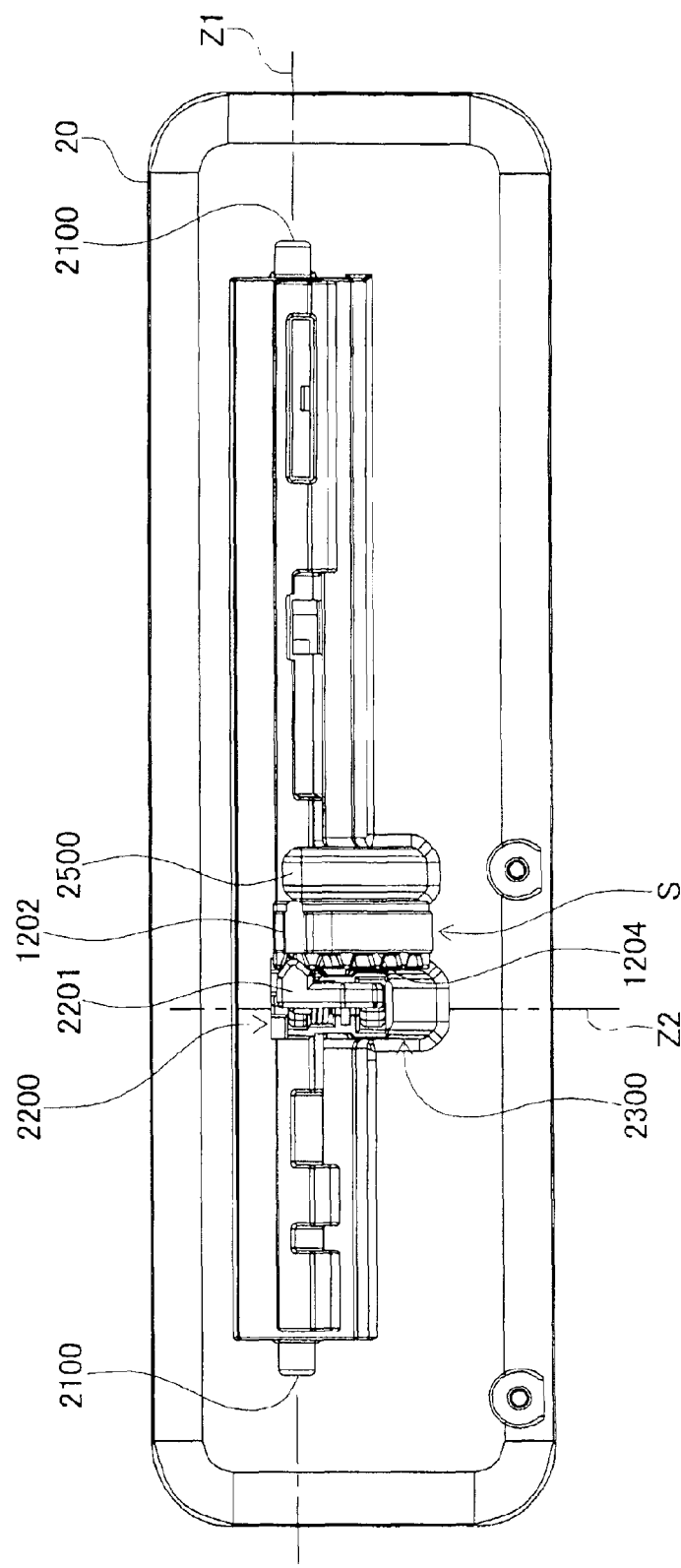
FIG. 17 is a plane view of the tilt assembly including the panel body and the engagement piece to be attached to the main body of the MFP according to the embodiment of the present invention.
Figures 19A, 19B:
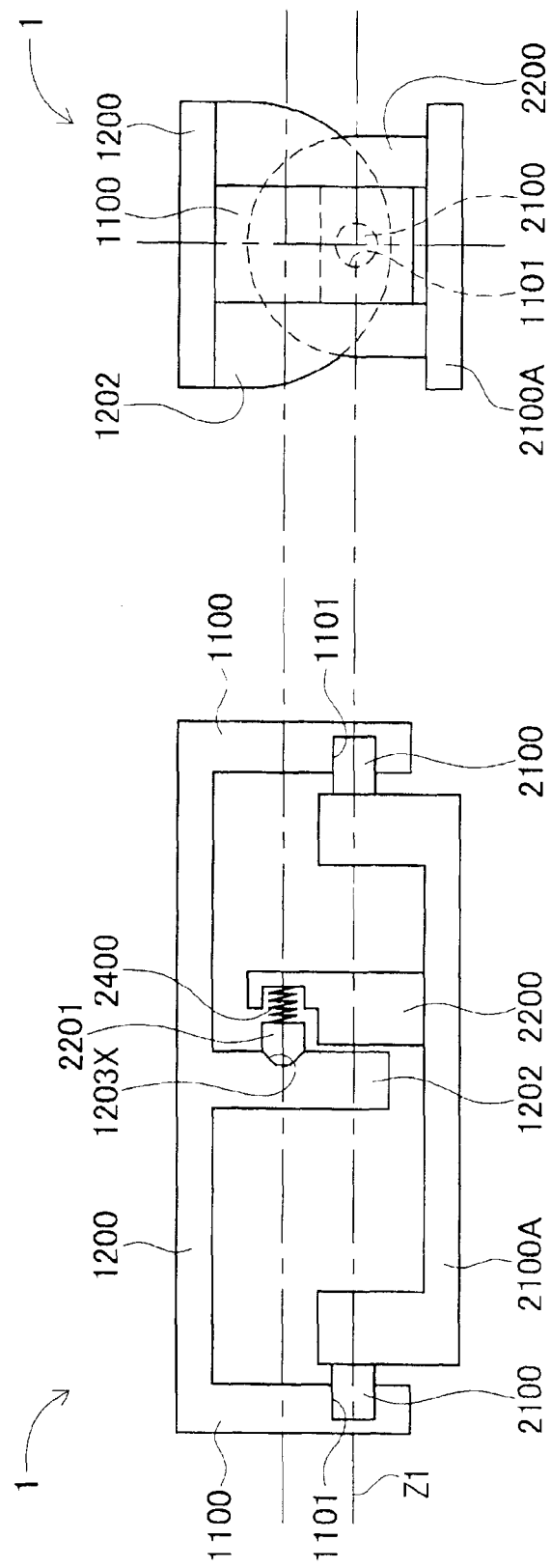
FIG. 19A is an illustrative plane view of the tilt assembly in the MFP according to the embodiment of the present invention.
FIG. 19B is an illustrative side view of the tilt assembly in the MFP according to the embodiment of the present invention.

More specifically, as depicted in FIGS. 16-17, the engagement piece support 2500 attached to the panel body 20 is in surface contact with the reverse side 1208 of the engagement piece 1202, which is fixed to the attachable portion 1201, to support the engagement piece 1200. Therefore, even when the engaging piece 2200 supported by the support portion 2300 on the panel body 20 is urged against the engagement piece 1202 by the urging force of the torsion coil spring 2400, the engagement piece support 2500 supporting the engagement piece 1202 accepts the impact applied to the engagement piece 1202 by the urging force. Accordingly, the positions of the engagement piece 1202 and the engaging piece 2200 are maintained, and the load to move the panel body 20 may be stabilized.

Next, configuration to move the tilt assembly 1 including the engagement piece support 2500 will be described with reference to FIGS. 22A-22B through 25A-25B. As depicted in FIGS. 22A-22B, 23A-23B and 25A-25B, as a part of the hinge structure disposed on the panel body 20, the engagement piece support 2500 is disposed in a longitudinal central area of the shaft member 2100A but in a leftward position with respect to the longitudinal center. The remainder of configuration of the hinge structure is the same as that described above with reference to FIGS. 18A-18B through 21A-21B.

The engagement piece 1202 attached to the main body 10 is disposed in the position between the engaging piece 2200 and the engagement piece support 2500, which are attached to the panel body 20. When the panel body 20 is rotated with respect to the main body 10 to be moved to one of the positions 20X, 20Y and 20Z, the wedge claw 2201 urged by the torsion coil spring 2400 is moved to one of the positions 2201X, 2201Y and 2201Z respectively. In this regard, the wedge claw 2201 fits in one of the three grooves 1203X, 1203Y and 1203Z formed in the engagement piece 1202 attached to the main body 10. Meanwhile, the wedge claw 2201 is urged against the engagement piece 1202 by the torsion coil spring 2400, and the wedge claw 2201 fits in the one of the three grooves 1203X, 1203Y and 1203Z steadily. Thus, when the tilt angle of the panel body 20 with respect to the main body 10 is adjusted, the engagement piece 1202 being urged by the torsion coil spring 2400 is urged against the engagement piece support 2500 attached to the panel body 20.

In this regard, the urging force from the torsion coil spring 2400 is transmitted via the engagement piece 1202, which is attached to the main body 10, to the engagement piece support 2500, which is attached to the panel body 20, and absorbed thereat. Therefore, the urging force from the torsion coil spring 2400 does not affect the bearings 1101, which are formed in the main body 10 and in which the shafts 2100 of the panel body 20 are inserted. Thus, when the user adjusts the tilt angle of the pane 20, the panel body 20 can be smoothly rotated in the bearings 1101, which are not affected by the urging force from the torsion coil spring 2400.

In the tilt assembly 1 with the engagement piece support 2500 according to the embodiment, it may not be necessary that the engagement piece 1202 is formed to have the grooves 1203. More specifically, the tilt angle of the panel body 20 with respect to the main body 10 may be adjusted even without any groove 1203 formed in the engagement piece 1202. That is, for example, the engagement piece 1202 may be replaced with a break disc, and the wedge claw 220 may be replaced with a break shoe urged by the torsion coil spring 2400. With the break disc and the break show functioning as a disc break, the tilt angle of the panel body 20 with respect to the main body 10 may be controlled by friction force produced in between the break disc and the break shoe.

3. More Examples

Although examples of carrying out the invention has been described, those skilled in the art will appreciate that there are numerous variations and permutations of the electric device and the tilt assembly that fall within the spirit and scope of the invention as set forth in the appended claims. It is to be understood that the subject matter defined in the appended claims is not necessarily limited to the specific features or act described above. Rather, the specific features and acts described above are disclosed as example forms of implementing the claims.

Figure 26:
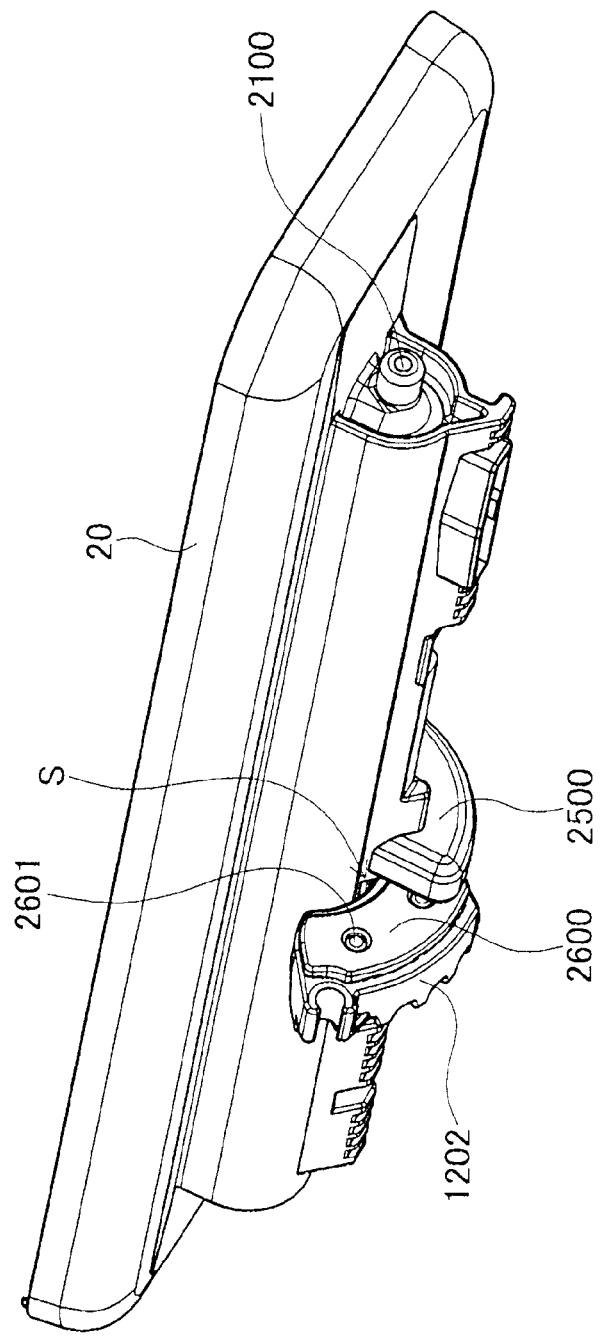
FIG. 26 is a perspective view of the panel body of the MFP according to the embodiment of the present invention.

For example, as depicted in FIG. 26, the tilt assembly 1 may be equipped with the resilient member 2600, which may be disposed in a position between the engagement piece support 2500 and the engagement piece 1202. The resilient member 2600 may be fixed to the engagement piece 1202 by, for example, screws 2601. With the resilient member 2600, the engagement piece support 2500 and the engagement piece 1202 may be more smoothly moved with respect to each other. Accordingly, when the user adjusts the tilt angle of the panel body 20 with respect to the main body 10, the panel body 20 may be moved smoothly. Optionally, the resilient member 2600 may be fixed to the engagement piece support 2500 rather than the engagement piece 1200.

The resilient member 2600 may be a rubber sheet made of, for example, silicon rubber or Teflon (registered trademark) rubber, or may be made of, for another example, felt or cork.

For another example, the tilt assembly 1 may be in a reversed configuration. That is, the support portion 2300 may be disposed to the main body 10, and the engaging piece 200 may be rotatably supported by the support portion 2300 on the main body 100. Meanwhile, the attachable portion 1201 is disposed on the panel body 20 so that the engagement piece 1202 can be fixed to the attachable portion 1201 on the panel body 20.

Figure 27:
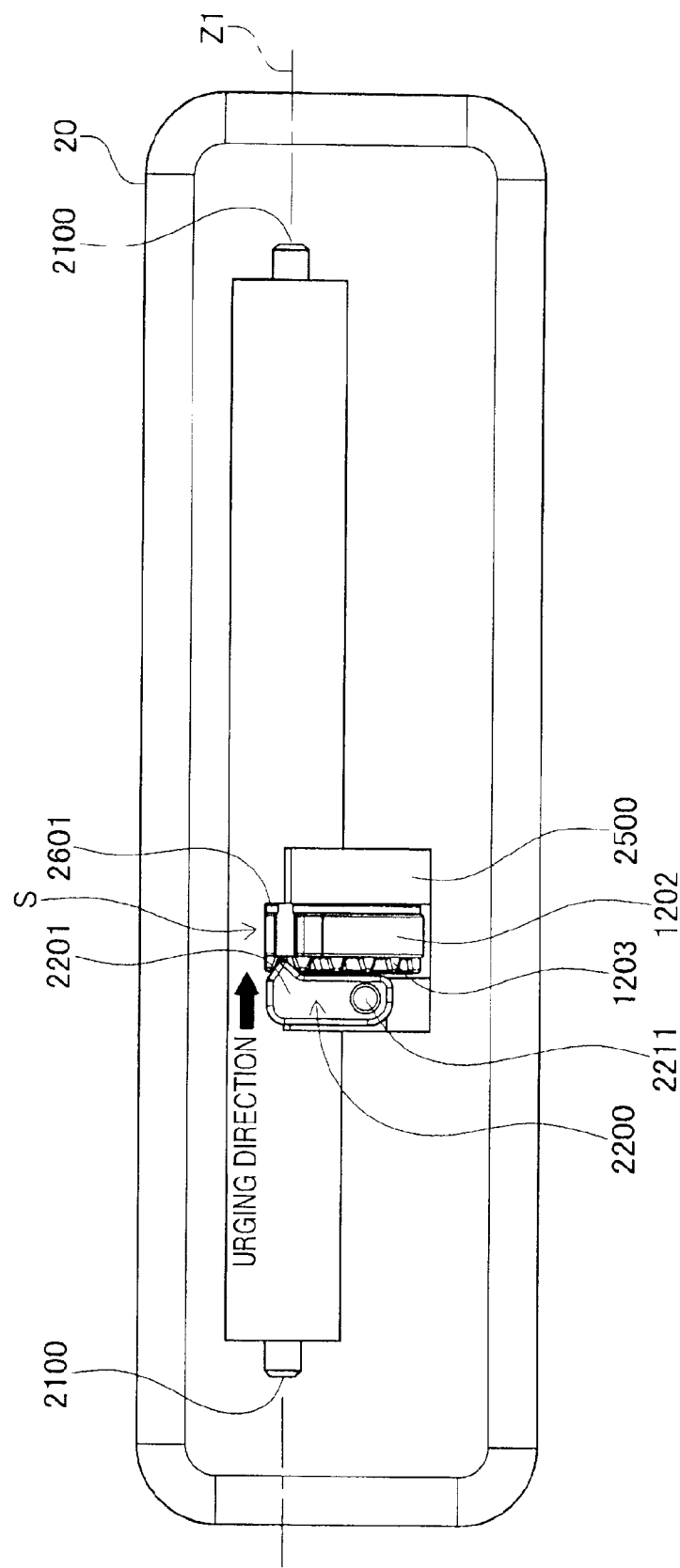
FIG. 27 is a plane view of the tilt assembly in the MFP according to a second embodiment of the present invention.
Figure 28:
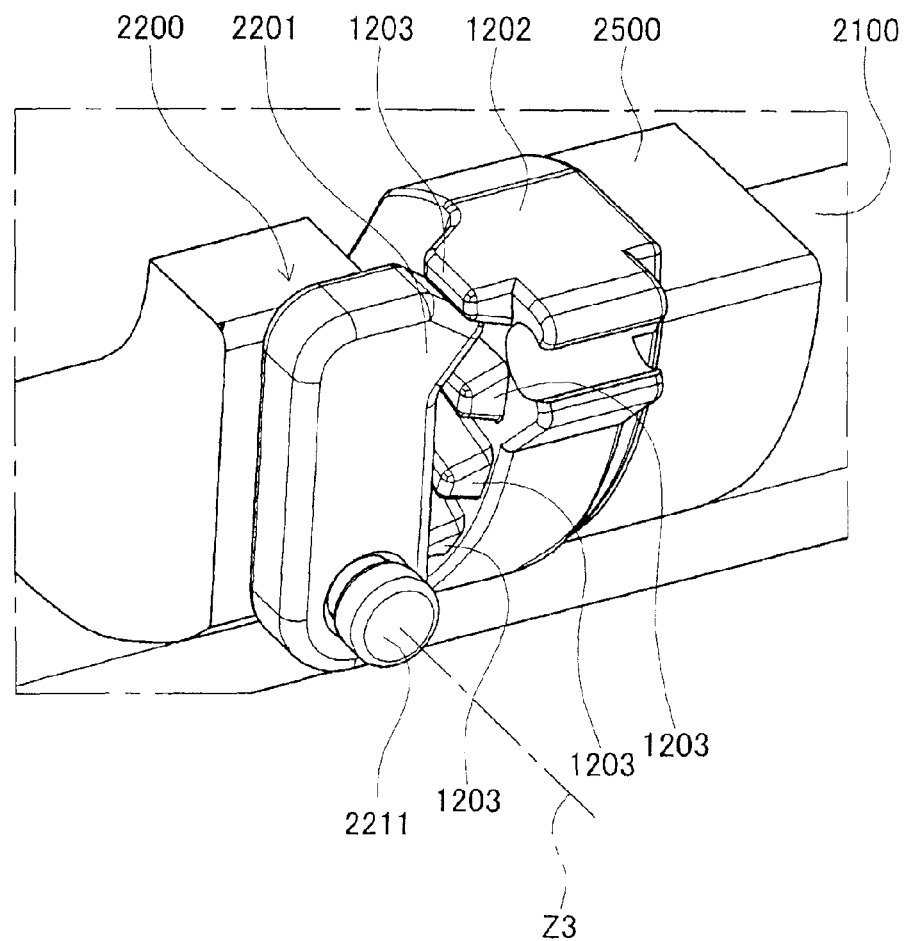
FIG. 28 is a perspective view of the tilt assembly in the MFP according to the second embodiment of the present invention.
Figure 29:
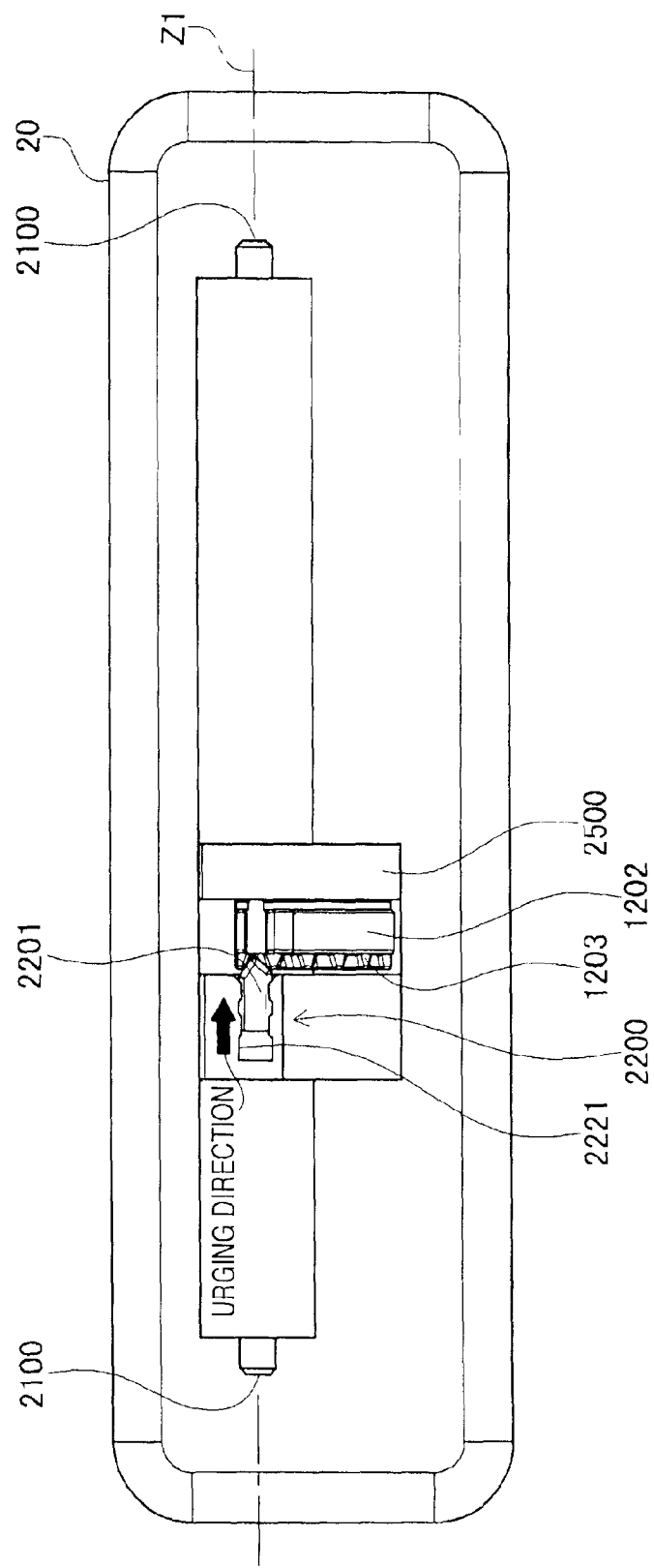
FIG. 29 is a plane view of the tilt assembly in the MFP according to a third embodiment of the present invention.
Figure 30:
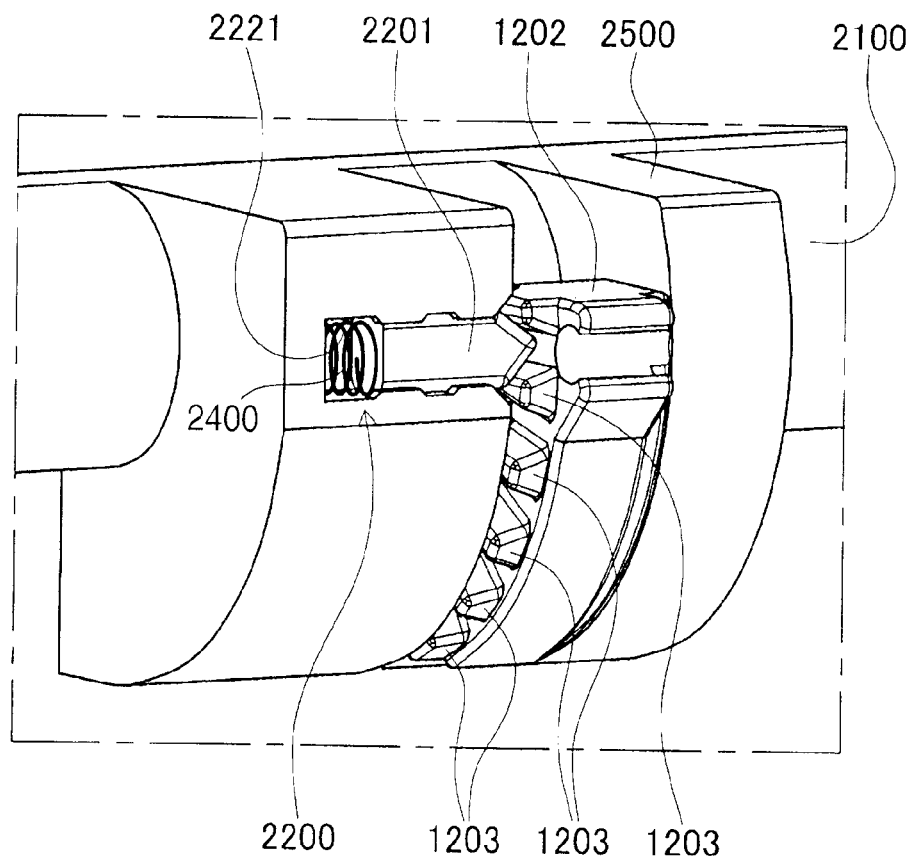
FIG. 30 is a perspective view of the tilt assembly in the MFP according to the third embodiment of the present invention.

For another example, the tilt assembly 1 may be replaced with a different configuration shown in FIGS. 27-28. As depicted in FIGS. 27-28, a rotation shaft 2211, about which the wedge claw 2201 of the engaging piece 2200 attached to the panel body 20 rotates, may be arranged in a position to extend orthogonally with respect to a back surface of the panel body 20. In this configuration, the engaging piece 2200 can be urged against the engagement piece 1202 along the direction in parallel with the rotation axis Z1. Thus, the wedge claw 2201 of the engaging piece 2200, which is attached to the panel body 20, can be moved along the direction in parallel with the rotation axis Z, which coincides with the shafts 2100, to fit in one of the plurality of grooves 1203C formed in between the teeth 1203 formed in the engagement piece 1202, which is attached to the main body 10.

More specifically, in the tilt assembly shown in FIGS. 27, 28, the wedge claw 2201 of the engaging piece 2200 is rotatable about an axis Z3, which extends orthogonally with respect to the rotation axis Z1 in a position separated from the rotation axis Z1 for a predetermined second distance. In this arrangement, the wedge claw 2201 of the engaging piece 2200 can be moved along the direction of the rotation axis Z1 and urged against the engagement piece 1202 easily.

For another example, a rail 2221, which extends along the rotation shaft Z1 to guide the wedge claw 2201, may be attached or formed on the back surface of panel body 20. The engaging piece 2200 may be supported on the rail 2221 and guided along the rotation axis Z1 to be urged against the engagement piece 1202 by the urging force from the toil spring 2400. In this arrangement, the wedge claw 2201 of the engaging piece 2200 can be moved along the direction of the rotation axis Z1 and urged against the engagement piece 1202 to be fitted in one of the grooves 1203C formed in between the teeth 1203 in the engagement piece 1202.

What is claimed is:

1. An electric device comprising a main body and a panel body, the panel body comprising at least one of a display unit and an input unit and being rotatable with respect to the main body about a rotation axis, the electric device comprising:
    an engagement piece mounted on one of the panel body and the main body and formed to have a plurality of teeth on a plane which spreads orthogonally with respect to the rotation axis, the plurality of teeth being disposed along a circumference centered on the rotation axis at a predetermined interval from one another; and
    an engaging piece mounted on the other one of the panel body and the main body,
    wherein the engaging piece comprises:
        an engaging claw movable to be closer to and farther from the engagement piece; and
        an urging member constructed to urge the engaging claw in a direction to be closer to the engagement piece;
    wherein the engaging claw is rotatably supported on the other one of the panel body and the main body to rotate about an axis which extends orthogonally with respect to the rotation axis.

2. The electric device according to claim 1,
    wherein the axis, about which the engaging claw is rotatable, extends orthogonally with respect to the rotation axis in a position apart from the rotation axis for a predetermined distance.

3. The electric device according to claim 1,
    wherein the engaging claw is movably supported on the other one of the panel body and the main body to move along a direction in parallel with the rotation axis.

4. The electric device according to claim 1,
    wherein the engagement piece is formed in a shape such that juts of the plurality of teeth are formed in a sectorial arrangement centered on the rotation axis to orient from outside toward inside along radial directions, and lateral planes of adjoining juts facing each other along the circumference extend in parallel with each other.

5. The electric device according to claim 1, further comprising:
    an engagement piece supporting member mounted on the other one of the panel body and the main body, on which the engaging claw is supported, the engagement piece supporting member being disposed in a position spaced apart from the engaging piece along a direction in parallel with the rotation axis and along a direction of the urging member to urge the engaging claw.

6. The electric device according to claim 5, further comprising:
    a resilient member disposed in a position between the engagement piece supporting member and the engagement piece, the resilient member being fixed to one of the engagement piece supporting member and the engagement piece.

7. The electric device according to claim 1,
    wherein the engaging claw is made of a material, of which anti-wear quality is higher than anti-wear quality of the teeth.

8. The electric device according to claim 1,
wherein the teeth are made of a material, of which anti-wear quality is higher than anti-wear quality of the engaging claw.

9. The electric device according to claim 1,
wherein an engagement piece supporting member is mounted on the other one of the panel body and the main body, on which the engaging claw is supported; and
wherein the engagement piece is disposed in an intermediate position between the engaging claw and the engagement piece supporting member to be urged by the urging member toward the engagement piece supporting member.

* * * * *